United States Patent
Hashimoto et al.

[11] Patent Number: 6,136,506
[45] Date of Patent: Oct. 24, 2000

[54] ULTRAVIOLET-CURABLE AND ALKALI-DEVELOPING TYPE PHOTO SOLDER RESIST INK

[75] Inventors: Soichi Hashimoto, Kyotanabe; Koichi Yoshioka, Uji; Masahiro Mizushima, Kyoto; Toshikazu Oda, Uji, all of Japan

[73] Assignee: GOO Chemical Co., Ltd.

[21] Appl. No.: 09/100,756

[22] Filed: Jun. 22, 1998

[51] Int. Cl.$^7$ .................................. G03F 7/038
[52] U.S. Cl. ..................... 430/280.1; 430/284.1; 522/100
[58] Field of Search .............. 430/280.1, 284.1; 522/100

[56] References Cited

U.S. PATENT DOCUMENTS

| | | | |
|---|---|---|---|
| 4,943,516 | 7/1990 | Kamayachi et al. | 430/280.1 |
| 5,009,982 | 4/1991 | Kamayachi et al. | 430/280.1 |

FOREIGN PATENT DOCUMENTS

| | | | |
|---|---|---|---|
| 56-40329 | 9/1981 | Japan . | |
| 56-40329 B2 | 9/1981 | Japan . | |
| 61-243869 | 10/1986 | Japan . | |
| 63-196619A | 8/1988 | Japan . | |
| 01141904 | 6/1989 | Japan . | |
| 1-141904 | 6/1989 | Japan . | |
| 03250012 | 11/1991 | Japan . | |
| 3-250012 | 11/1991 | Japan . | |
| 04217252 | 8/1992 | Japan . | |
| 4-217252 | 8/1992 | Japan . | |
| 06095384 | 4/1994 | Japan . | |
| 6-95384 | 4/1994 | Japan . | |
| 7-238148 | 9/1995 | Japan | 430/280.1 |

OTHER PUBLICATIONS

GOO Chem, 1997–498375, Derwent Information Ltd, English Abstract of JP 09–235348A issued Sep. 9, 1997.
English translation of Jp. 05–179185A, Suichii et al. issued Jul. 1993, Translation b Schreiber Translations, Inc for PTO, Apr. 1997.

*Primary Examiner*—Cynthia Hamilton
*Attorney, Agent, or Firm*—Arent Fox Plotkin Kintner Kahn

[57] ABSTRACT

An ultraviolet-curable and alkali-developing type photo solder resist ink comprises an epoxy resin obtained by extending chains of an epoxy compound by an isocyanate compound having at least two isocyanate groups per one molecule of the isocyanate compound, an ultraviolet-curable resin having carboxyl group and an ethylenically unsaturated group having a photopolymerization capability, a photopolymerization initiator, and a diluent. The resist ink shows a wide precuring acceptable width for providing an extended shelf life, a good tacky-dry property after a pre-curing step, excellent light-sensitivity at an exposing step, superior resolution, and improved removability of a film of the resist ink by an alkaline solution at a developing step. In addition, a solder resist obtained by a post-baking step of the resist ink film provides excellent resistances to molten solder and gold plating.

11 Claims, 6 Drawing Sheets

Retention Time (min.)

Retention Time (min.)

ULTRAVIOLET-CURABLE AND ALKALI-DEVELOPING TYPE PHOTO SOLDER RESIST INK

BACKGROUND OF THE INVENTION

1. Field of the Invention

The present invention relates to an ultraviolet-curable and alkali-developing type photo solder resist ink which can be used to manufacture printed circuit boards.

2. Disclosure of the Prior Art

Recently, dry films or liquid type photo solder resist inks having excellent resolution and dimensional accuracy have been widely used to form a solder resist pattern in a manufacturing process of a printed circuit board with high wiring density. For example, Japanese Patent Publication [KOKOKU] No. 56-40329 discloses a composition comprising an ultraviolet-curable type resin obtained by a reaction of an unsaturated monocarboxylic acid with an epoxy resin and an addition of a polybasic acid anhydride to the epoxy resin. In addition, Japanese Patent Early Publication [KOKAI] No. 61-243869 discloses a liquid type photo solder resist ink containing thermosetting components of an epoxy compound, a diluent, a photopolymerization initiator, and an alkali-developing and ultraviolet-curable type resin obtained by an addition of a polybasic acid anhydride to a novolac-type epoxy acrylate.

By using these resist inks, a solder resist pattern can be formed on a substrate for a printed circuit board according to the following method. That is, the resist ink is applied to the substrate having a conductor pattern to obtain a resist ink layer thereon by a dipping method, spray method, screen printing, and so on. Next, as a precuring step, an organic solvent contained in the resist ink layer is volatilized at a temperature of 60° C. to 120° C. to obtain a resist ink film. After a mask having a desired pattern is mounted on the resist ink film, ultraviolet is radiated to the resist ink film through the mask by using a light source such as a high-pressure mercury-vapor lamp, xenon lamp, chemical lamp, ultrahigh-pressure mercury vapor lamp, metal halide lamp, and so on. In a developing step after the ultraviolet radiation, unexposed portions of the resist ink film are dissolved by an alkaline solution to obtain a patterned resist ink film. Then, the patterned resist ink film is heated at 120° C to 180° C. for about 30 minutes to cure the epoxy compound in the resist ink film, so that strength, hardness and chemical resistance of the resist ink film are improved. This step is known as a post-baking step. In this method, the precuring step is very important to obtain the resist ink film having non-tackiness. The non-tackiness of the resist ink film improves a removability of the mask from the resist ink film after the exposing step, and prevents a contamination of the mask.

However, when the resist ink contains an epoxy compound, there is a problem that a thermosetting phenomenon is caused at the precuring step by a reaction between the epoxy compound and carboxylic group of the ultraviolet-curable resin. This brings about a deterioration of the developing property or the resolution of the resist ink. In particular, when the epoxy compound is a solvent-dissolving type epoxy compound, the precuring step is acceptable only under a limited gentle condition with respect to temperature and time, for example, less than 20 minutes at 80° C., and in a particular case less than 30 minutes at 80° C. An acceptable condition range of the precuring step is called as a precuring acceptable width.

In such a gentle condition of the precuring step, since a diluent often remains in the resist ink film, there are problems that the removability of the mask from the resist ink film lowers and the contamination of the mask easily occurs. This means that a tacky-dry property of the resist ink film is poor. When the resist ink film is excellent in the tacky-dry property, no tackiness is felt when fingers lightly touch a surface of the resist ink film.

In the actual manufacturing process of printed circuit boards, the resist ink film is often stored for several days after the precuring step. In such a case, there is a tendency that the developing property and the resolution of the resist inks described above are deteriorated because the reaction of the epoxy compound with carboxylic group of the ultraviolet-curable resin gradually proceeds at a room temperature during the storing period.

For solving the above problems, Japanese Patent Early Publication [KOKAI] Nos. 1-141904, 3-250012, and 4-217252 disclose ultraviolet-curable and alkali-developing type photo solder resist inks. In those references, a fine powder of triglycidyl isocyanurate or the like having a sparing solubility to the diluent is used as the epoxy compound. The fine powder is mixed with an ultraviolet-curable resin obtained by an addition of an acid anhydride to a bisphenol A-type epoxy acrylate or a novolac-type epoxy acrylate to provide the ultraviolet-curable and alkali-developing type photo solder resist inks.

In case of using these resist inks, since the powder-like epoxy compound is not uniformly dispersed as a solid state in the resist ink film at the precuring step, contacts of the epoxy compound with the carboxylic group of the ultraviolet-curable resin decrease, so that the curing reaction is difficult to proceed. In addition, since the ultraviolet-curable component exists at a high concentration in the resist ink film except for the dispersed portions of the powder-like epoxy compound after the precuring step, a decrease in the light-sensitivity of the resist ink film can be prevented. Moreover, when the resist ink film is heated at a higher temperature than a melting point of the epoxy compound at the post-baking step, the strength, hardness and chemical resistance of the resist ink film can be improved. Due to these advantages, the powder-like epoxy compound having the sparing solubility to the diluent may be preferably used.

By the way, after the precuring step, the thermosetting property of the resist ink film is influenced by the particle size of the powder-like epoxy compound. Even when the powder-like epoxy compound is melted at the post-baking step, it is difficult to obtain a uniform mixing state of the epoxy compound and the ultraviolet-curable resin in the resist ink film. Consequently, definite boundaries between the epoxy compound and the ultraviolet-curable resin components occur. The definite boundaries prevent a curing reaction therebetween at the post-baking step to cause disadvantages with respect to the heat resistance and the electrical corrosion resistance of the resist ink film.

For solving this inconvenience, it is proposed to make an extremely fine powder of the epoxy compound by various physically pulverizing methods. But, there is a limit in the particle size of the fine powder obtained by the physically pulverizing methods. Japanese Patent Early Publication [KOKAI] No. 6-95384 discloses a photo solder resist ink comprising an ultraviolet-curable resin and triglycidyl isocyanurate as the epoxy compound which is a solid state at a room temperature and has the sparing solubility to the diluent. It indicates that making the extremely-fine powder of the epoxy compound and utilizing a particular dispersing method of the powder-like epoxy compound are important to improve the light-sensitivity of the resist ink at the exposing step and enhance the thermosetting reaction at the post-baking step. In an example of this reference, it is described that a sufficient effect can be not obtained by simply pulverizing triglycidyl isocyanurate by a roll-mill and so on.

Thus, the precuring acceptable width can be improved by using the extremely fine powder of the epoxy compound having the sparing solubility to the diluent. However, there is a limit as to the improvement of the heat resistance and the electrical corrosion resistance of the resist ink film.

SUMMARY OF THE INVENTION

A primary object of the present invention is to provide an alkali-developing and ultraviolet-curable type photo solder resist ink. The resist ink comprises an epoxy resin obtained by extending chains of an epoxy compound by an isocyanate compound having at least two isocyanate groups per one molecule of the isocyanate compound, an ultraviolet-curable resin having a carboxyl group and an ethylenically unsaturated group with a photopolymerization capability, a photopolymerization initiator, and a diluent. The resist ink of the present invention has a wide precuring acceptable width, therefore, it is possible to store a film of the resist ink for an extended time period after a precuring step in a manufacturing process of a printed circuit board. In addition, the resist ink shows a good tacky-dry property after the precuring step, excellent light-sensitivity at an exposing step in the manufacturing process, superior resolution, and excellent adhesion with the substrate. The resist ink of the present invention is capable of providing a solder resist having excellent chemical resistance, electrical corrosion resistance, heat resistance to solder, and resistance to gold plating.

It is preferred that the epoxy compound is an aromatic epoxy resin. In particular, it is preferred that the aromatic epoxy resin is a novolac-type epoxy resin. A phenol novolac-type epoxy resin, cresol novolac-type epoxy resin, or a bisphenol A-novolac-type epoxy resin may be preferably used as the novolac-type epoxy resin.

It is also preferred to use tolylene diisocyanate, xylylene diisocyanate, hydrogenated xylylene diisocyanate, and isophorone diisocyanate as the isocyanate compound.

In a preferred embodiment of the present invention, the ultraviolet-curable resin is an epoxy acrylate resin which is obtained by an addition reaction of an unsaturated mono-calboxylic acid and one of unsaturated and saturated polybasic acid anhydrides to an epoxy resin.

In a further preferred embodiment of the present invention, the ultraviolet-curable resin is obtained by a reaction of a copolymer consisting essentially of 40 to 100 mol % of a first ethylenically-unsaturated monomer having an epoxy group and 60 mol % or less of a second ethylenically-unsaturated monomer having a polymerization capability with the first ethylenically-unsaturated monomer with 0.7 to 1.2 chemical equivalent of a third ethylenically-unsaturated monomer having a single carboxyl group per one epoxy-equivalent of the copolymer and one of saturated and unsaturated polybasic anhydrides. In this case, it is preferred to use glycidyl (meth) acrylate as the first ethylenically-unsaturated monomer. It is preferred to use a (meth) acrylic acid aliphatic ester, (meth) acrylic acid alicyclic ester, hydroxy alkyl (meth) acrylate, alkoxy alkyl (meth) acrylate, and glycerol (meth) acrylate as the second ethylenically-unsaturated monomer. In addition, it is preferred to use an (meth) acrylic acid, crotonic acid and cinnamic acid as the third ethylenically-unsaturated monomer.

A further object of the present invention is to provide printed circuit boards manufactured by using the photo solder resist ink of the present invention.

These and still other objects and advantages will become apparent from the following detail descriptions of the preferred embodiments and examples of the invention when taken in conjunction with the attached drawings.

DETAIL DESCRIPTION OF THE PREFERRED EMBODIMENTS

Figure 1:
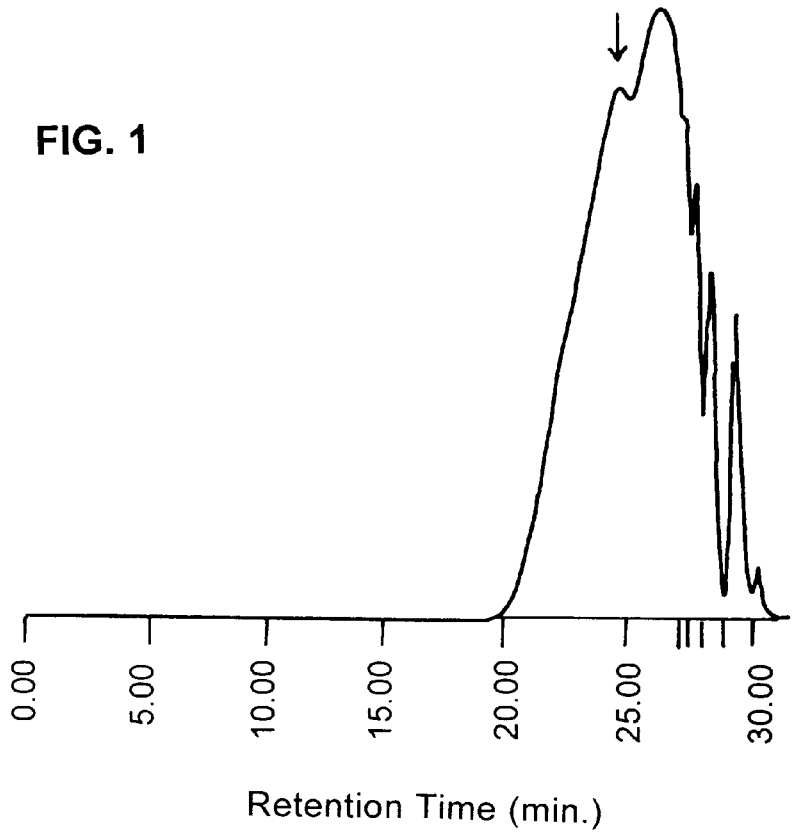
FIG. 1 is a GPC (Gel Permeation Chromatography) chart of an epoxy resin (A-1) prepared in Example 1 of the present invention.

An epoxy resin (A) contained in an alkali-developing and ultraviolet-curable type photo solder resist ink of the present invention is explained in detail. The epoxy resin (A) is obtained by extending chains of an epoxy compound by an isocyanate compound having two or more of isocyanate groups per one molecule of the isocyanate compound. As the epoxy compound, it is possible to use a phenol novolac-type epoxy resin, cresol novolac-type epoxy resin, bisphenol A-type epoxy resin, bisphenol A-novolac-type epoxy resin, bisphenol F-type epoxy resin, polyol polyglycidyl ether compound such as sorbitol polyglycidyl ether, sorbitan polyglycidyl ether, glycerol polyglycidyl ether, diglycerol polyglycidyl ether, polyglycerol polyglycidyl ether, neopenthylglycol polyglycidyl ether, trimethylol propane polyglycidyl ether, pentaerythritol polyglycidyl ether, 1,6-hexanediol polyglycidyl ether, ethyleneglycol diglycidyl ether, polyethyleneglycol diglycidyl ether, propyleneglycol diglycidyl ether, polypropyleneglycol diglycidyl ether, tetramethyleneglycol diglycidyl ether, polytetramethyleneglycol diglycidyl ether, and resorcin diglycidyl ether, glycidyl ester compound such as adipic diglycidyl ester and o-phthalic diglycidyl ester, N-glycidyl-type epoxy resin, alycyclic-type epoxy resin (e.g., "EHPE-3150" manufactured by Daicel Chemical Industries, Ltd.), tris (hydroxyphenyl) methane-based polyfunctional epoxy resin (e.g., "EPPN-501" and "EPPN-502H" manufactured by NIPPON KAYAKU Co., LTD. or "TACTIX-742" and "XD-9053" manufactured by DOW CHEMICAL), hydrogenated bisphenol A-type epoxy resin, dicyclopentadiene-phenol-type epoxy resin, and epoxy resin having at least two epoxy group per one molecule thereof such as a naphthalene-type epoxy resin. At least one compound selected from the above group can be used as the epoxy compound. In particular, it is preferred to use a phenol novolac-type epoxy resin, cresol novolac-type epoxy resin, bisphenol A-type epoxy resin, bisphenol A-novolac-type epoxy resin, or bisphenol F-type epoxy resin. When using these epoxy compounds, the epoxy resin (A) has a low epoxy equivalent and a large molecular weight, so that a sufficient curing reaction can be achieved at a post-baking step in a manufacturing process of a printed circuit board.

As the isocyanate compound having two or more of isocyanate groups per one molecule of the isocyanate compound, it is possible to use 2,4-tolylene diisocyanate, 2,6-tolylene diisocyanate, xylylene diisocyanate, hydrogenated xylylene diisocyanate, isophorone diisocyanate, 4,4'-diphenylmethane diisocyanate, toluidine diisocyanate, lysine diisocyanate, trimethylene diisocyanate, tetramethylene diisocyanate, hexamethylene diisocyanate, trimethyl hexamethylene io diisocyanate, triphenylmethane triisocyanate, and polymethylene polyphenyl polyisocyanate. At least one selected from the above group can be used as the isocyanate compound. In particular, it is preferred to use tolylene diisocyanate, xylylene diisocyanate, hydrogenated xylylene diisocyanate, and isophorone diisocyanate.

As an example, the epoxy resin (A) can be prepared by reacting the novolac-type epoxy compound with 0.1 to 15 wt %, and more preferably 0.2 to 10 wt % of the isocyanate compound with respect to the epoxy compound at a reaction temperature of 20 to 120° C. in the presence of a catalyst, e.g., an organic tin compound such as dibutyltin dilaurate or a tertiary amine such as benzyl dimethyl amine. In this case, when the amount of the epoxy compound is less than 0.1 wt %, a sufficient amount of the extended chains is not obtained. When the amount of the epoxy compound is more than 15 wt %, a storage stability of the photo solder resist ink is easily lowered.

In this reaction, it is believed that functional groups included in the epoxy compound, for example, hydroxyl groups, react with the isocyanate groups of the isocyanate compound to form an urethane bonding, so that bridged bonds for extending the chains of the epoxy compound are obtained. Since the isocyanate compound has two or more of isocyanate groups per one molecule thereof, the bridged bonds can extend the chains of the epoxy compound. For example, the hydroxyl group included in the epoxy compound may be a by-product derived from an epoxy group such as a glycol group or a secondary hydroxyl group. As a raw material of the epoxy resin (A), it is possible to use an epoxy compound having groups capable of reacting with the isocyanate groups. This reaction is performed at a ratio of 0.05 to 1.5 chemical equivalent, and more preferably 1.0 chemical equivalent or less of isocyanate groups with respect to the functional groups of the epoxy compound. In case of an excess amount of the isocyanate groups, it is preferred to consume unreacted isocyanate groups by a compound containing hydroxyl groups after the reaction is finished.

A weight-average molecular weight of the epoxy resin (A) can be flexibly adjusted by controlling a compounding ratio of the isocyanate compound to the epoxy compound. By selecting a suitable compounding ratio, the epoxy resin (A) can be a solid state having non-tackiness at a room temperature. The photo solder resist ink containing the epoxy resin (A) of the present invention can provide a wide precuring acceptable width and a good tacky-dry property after a precuring step in the manufacturing process of the printed circuit board.

The epoxy resin (A) with the extended chains usually has a bridged-bond structure therein. A bridged-bond density in the epoxy resin (A) increases at a post-baking step in the manufacturing process by a further polymerization of epoxy groups, or a sealing of carboxyl groups included in the resist ink by the epoxy groups. As a result, a finally-formed solder resist is stabilized physically and chemically, and the heat resistance to solder, chemical resistance, electrical corrosion resistance, and the resistance to gold plating are improved.

By the way, as described before, when resist ink contains an epoxy compound of the past, a thermosetting reaction proceeds at the precuring step, so that defects in developing and deterioration in resolution easily occur. In particular, when using an epoxy compound showing a compatibility with an ultraviolet-curable resin and a diluent, those problems become serious. A powder-like epoxy compound having a sparing solubility to the diluent has been used to solve the problems.

In the resist ink of the present invention, the epoxy resin (A) with the extended chains shows a compatibility with an ultraviolet-curable resin (B) and a diluent (D) explained later. In addition, the epoxy resin (A) shows a good compatibility with the ultraviolet-curable resin component having a carboxyl group in a dried resist ink film. Nevertheless, the defects in developing and the deterioration in resolution do not occur in the resist ink film of the present invention. On the contrary, the photo solder resist ink is excellent in the developing and resolution properties, and the precuring acceptable width. Although the reason has not been clarified yet, the following hypothesis can be proposed. That is, it appears that the epoxy resin (A) shows the good compatibility with the ultraviolet-curable resin component having the carboxyl group in the dried resist ink film at a macro scale. However, at a micro scale, it is assumed that the epoxy resin (A) is in a phase-separation relation with ultraviolet-curable resin component in such a degree that the thermosetting reaction therebetween is difficult to proceed under the precuring condition. At present, it is believed that the above-described advantages are brought by the phase-separation state of the epoxy resin (A) from the ultraviolet-curable resin component at a micro scale much smaller than the case of using the fine powder of the epoxy compound of the past.

The epoxy resin (A) used to prepare the photo solder resist ink of he present invention has excellent heat resistance. Therefore, it is possible to use the epoxy resin (A) as a protect film for a color filter or in a manufacturing process of a pixel comprising a heat treatment performed at a high temperature more than 200° C.

An ultraviolet-curable resin (B) contained in the photo solder resist ink of the present invention is explained in detail. The ultraviolet-curable resin (B) has a carboxyl group and an ethylenically unsaturated group having a photopolymerization capability. This component is important to provide the removability of the photo solder resist ink by a diluted alkaline solution. For example, the ultraviolet-curable resin (B) may be one obtained by an addition of glycidyl (meth) acrylate or hydroxy ethyl (meth) acrylate to a maleic anhydride copolymer, one obtained by an addition of an ethylenically unsaturated monomer having a single epoxy group such as glycidyl (meth) acrylate to a copolymer of an ethylenically unsaturated monomer having a carboxyl group and an ethylenically unsaturated monomer having no carboxyl group such as styrene and (meth) acrylic ester, or one obtained by adding an unsaturated monocarboxylic acid such as (meth) acrylic acid to a polymer containing an ethylenically unsaturated monomer having an epoxy group as a unit, and reacting a resultant with a polybasic acid anhydride.

In addition, as the ultraviolet-curable resin (B), it is possible to use an epoxy acrylate resin, which is obtained by an addition of an unsaturated monocarboxylic acid and a saturated or unsaturated polybasic acid anhydride to an epoxy resin to introduce a photo-sensitive unsaturated group thereto. As the epoxy resin used to prepare the epoxy acrylate resin, it is possible to use a novolac-type epoxy resin such as a phenol novolac-type epoxy resin, cresol-type epoxy resin, bisphenol A novolac-type resin, bisphenol F-type epoxy resin, cyclic aliphatic epoxy resin (e.g., "EHPE-3150" manufactured by Daisel Chemical Industries, Ltd.), tris (hydroxyphenyl) methane-based polyfunctional epoxy resin (e.g., "EPPN-502H" manufactured by NIPPON KAYAKU Co. LTD., or "TACTIX-742" manufactured by DOW CHEMICAL), and a glycidyl ether-type epoxy resin such as a modified polybutadiene. These have two or more epoxy groups per one molecule. At least one selected from the above group can be used as the epoxy acrylate resin.

As the unsaturated monocarboxylic acid used to prepare the epoxy acrylate resin, it is possible to use (meth) acrylic acid, crotonic acid, cinnamic acid. In particular, it is preferred to use (meth) acrylic acid.

As the unsaturated or saturated polybasic acid anhydride used to prepare the epoxy acrylate resin, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, 3-methyl tetrahydrophthalic anhydride, 4-methyl tetrahydrophthalic anhydride, 3-ethyl tetrahydrophthalic anhydride, 4-ethyl tetrahydrophthalic anhydride, 3-propyl tetrahydrophthalic anhydride, 4-propyl tetrahydrophthalic anhydride, 3-butyl tetrahydrophthalic anhydride, 4-butyl tetrahydrophthalic anhydride, hexahydrophthalic anhydride, 3-methyl hexahydrophthalic anhydride, 4-methyl hexahydrophthalic anhydride, 3-ethyl hexahydrophthalic anhydride, 4-ethyl hexahydrophthalic anhydride, 3-propyl hexahydrophthalic anhydride, 4-propyl hexahydrophthalic anhydride, 3-butyl hexahydrophthalic anhydride, 4-butyl hexahydrophthalic anhydride and methyl nadic acid anhydride, and a polybasic acid anhydride such as trimellitic acid anhydride, pyromellitic acid anhydride, benzophenone tetracarboxylic anhydride and methyl cyclohexane tetracarboxylic anhydride.

The epoxy acrylate resin can be synthesized by various kinds of conventional methods. If necessary, a hydroxyl group, carboxylic group, or an epoxy group included in the ultraviolet-curable resin as a final product or an intermediate product obtained in the synthesizing method may be modified by a compound having a functional group reactive with those groups. As an example, it is possible to increase the number of an ethylenically unsaturated group, or increase the molecular weight.

It is preferred that an acid value of the epoxy acrylate resin is in a range of 30 to 160. When the acid value is within the range, the removability of the solder resist ink by a diluted alkaline solution and the chemical resistance of a cured resist ink film can be further improved.

In another preferred embodiment of the present invention, the ultraviolet-curable resin (B) is one obtained by a reaction of a hydroxy alkyl (meth) acrylate or a (meth) acrylate having an epoxy group with a copolymer of a maleic anhydride and an ethylenically unsaturated monomer. As the copolymer, it is possible to use a copolymer of styrene and a maleic anhydride (e.g., "SAM SERIES" manufactured by ATOCHEM, INC.), copolymer of a methylvinyl ether and a maleic anhydride (e.g., "GANTREZ AN SERIES" manufactured by ISP (INTERNATIONAL SPECIALTY PRODUCTS)), copolymer of a (meth) acrylic acid ester and a maleic anhydride, copolymer of α-olefin and a maleic anhydride, or a copolymer of a maleic anhydride, itaconic acid anhydride and an unsaturated monomer.

As the hydroxy alkyl (meth) acrylate or the (meth) acrylate having the epoxy group, it is possible to use a hydroxyl ethyl (meth) acrylate, glycidyl (meth) acrylate, or an epoxy cyclohexyl derivative of a (meth) acrylic acid such as (3, 4-epoxy cyclohexyle) methyl (meth) acrylate.

In a further preferred embodiment of the preferred embodiment, the ultraviolet-curable resin (B) is one obtained by a reaction of a copolymer of 40 to 100 mol % of an ethylenically unsaturated monomer having an epoxy group as a first component and as a second component 60 mol % or less of an ethylenically unsaturated monomer having a polymerization capability with the first component with 0.7 to 1.2 chemical equivalents of an ethylenically unsaturated monomer having a single carboxyl group as a third component with respect to one epoxy-equivalent of the copolymer and a saturated or unsaturated polybasic acid anhydride.

The first component provides the epoxy group to the copolymer. The reaction of the third component with the copolymer provides the ultraviolet-curability originating from ethylenically unsaturated double-bonds to the copolymer. Therefore, the ultraviolet-curability is directly influenced by a content of the first component with respect to the total amount of the first to third components. In this case, the content of the first component is within the range of 40 to 100 mol %, and more preferably 60 to 100 mol %. When the content is less than 40 mol %, a desired ultraviolet-curability is not obtained. In addition, the properties of the resist ink such as light-sensitivity, resolution, and resistance to molten solder, become worse.

As the first component, it is possible to use an epoxy cyclohexyl derivative of a (meth) acrylic acid such as glycidyl (meth) acrylate and (3,4-epoxy cyclohexyl) methyl (meth) acrylate, or an alicyclic epoxy derivative of a (meth) acrylic acid. In particular, it is preferred to use a glycidyl (meth) acrylate.

The second component is useful to control the ultraviolet-curability and the properties of a cured film of the solder resist ink. As the second component, it is possible to use a straight-chained or branch-chained alkyl ester of (meth) acrylic acid or (meth) acrylic acid alicyclic ester (This ester may have an unsaturated bond at a portion in a ring.) such as methyl (meth) acrylate, ethyl (meth) acrylate, propyl (meth) acrylate, butyl (meth) acrylate, isobutyl (meth) acrylate, tert-butyl (meth) acrylate, 2-ethylhexyl (meth) acrylate, n-octyl (meth) acrylate, n-decyl (meth) acrylate, isodecyl (meth) acrylate, lauryl (meth) acrylate, myristyl (meth) acrylate, cetyl (meth) acrylate, stearyle (meth) acrylate, cyclohexyl (meth) acrylate, and isobornyl (meth) acrylate, ethyleneglycol ester (meth) acrylate such as hydroxy ethyl (meth) acrylate, methoxy ethyl (meth) acrylate, ethoxy ethyl (meth) acrylate, diethyleneglycol mono (meth) acrylate, triethyleneglycol mono (meth) acrylate, and methoxy diethyleneglycol mono (meth) acrylate, propyleneglycol (meth) acrylate, butyleneglycol mono (meth) acrylate, glycerol (meth) acrylate, aromatic (meth) acrylate such as benzyl (meth) acrylate, (meth) acrylamide compound such as (meth) acrylamide, N-methyl (meth) acrylamide, N-propyl (meth) acrylamide, N-tert-butyl (meth) acrylamide, N-tert-octyl (meth) acrylamide, and diacetone (meth) acrylamide, vinyl pyrrolidone, (meth) acrylonitrile, vinyl acetate, styrene, α-methyl styrene, and a vinyl ether. At least one compound selected from the above list can be used as the second component. In particular, it is preferred to use a (meth) acrylic acid alicyclic ester, hydroxy alkyl (meth) acrylate, alkoxy alkyl (meth) acrylate, or a glycerol (meth) acrylate.

A solution polymerization or emulsion polymerization may by used to prepare the polymer. For example, in the solution polymerization, a polymerization initiator is added to a mixture of the first and second components in the presence of an organic solvent, and then the resultant is heated under a nitrogen flow while being agitated. Alternatively, the organic solvent, the polymerization initiator, and the mixture can be polymerized under a reflux. As the organic solvent used in the solution polymerization, it is possible to use a ketone such as methyl ethyl ketone and cyclohexanone, aromatic hydrocarbon such as toluene and xylene, acetic ester such as ethyl acetate, butyl acetate, cellosolve acetate, butyl cellosolve acetate, butyl carbitol acetate and propyleneglycol monomethyl ether acetate, and dialkylglycol ether.

As the polymerization initiator, it is possible to use a hydroperoxide such as di-isopropyl benzene hydroperoxide, cumene hydroperoxide and tert-butyl hydroperoxide, dialkyl peroxide such as dicumyl peroxide, 2,5-dimethyl-2,5-di-(tert-butyl peroxy)-hexane, 1,3-bis-(tert-butyl peroxy isopropyl)-benzene, tert-butyl cumyl peroxide, di-tert-butyl peroxide, 2,5-dimethyl-2,5-di-(tert-butyl peroxy)-hexyne-3, diacyl peroxide such as isobutyryl peroxide, 2,4-dichlorobenzoyl peroxide, lauroyl peroxide, benzoyl peroxide, acetyl peroxide, ketone peroxide such as methyl ethyl ketone peroxide, methyl isobutyl ketone peroxide, cyclohexanone peroxide, acetyl acetone peroxide, alkyl per ester such as tert-butyl peroxy pivalate, tert-butyl peroxy-2-ethyl hexanoate, tert-butyl peroxy-3,5,5-trimethyl hexanoate, tert-butyl peroxy acetate and tert-butyl peroxy benzoate, peroxy dicarbonate such as di-isopropyl peroxy dicarbonate, di-2-ethyl hexyl peroxy dicarbonate and di-sec-butyl peroxy dicarbonate, azo-compound such as azobisisobutylonitrile, 2,2'-azobisisomethyl butyrate, azobiscyanovaleronitrile, 1,1'-azobis(cyclohexene-1-carbonitrile) and 2,2'-azobis{2-methyl-N-(2-hydroxy ethyl)-propionamide. In addition, a redox initiator may be used as the polymerization initiator. If necessary, a conventional chain transfer agent may be used to control the molecular weight of the copolymer.

As the third component, it is possible to use at least one of (meth) acrylic acid, crotonic acid and cinnamic acid. In particular, it is preferred to use (meth) acrylic acid from the viewpoint of excellent ultraviolet-curability of the ultraviolet-curable resin (B). The copolymer is reacted with 0.7 to 1.2 chemical equivalents of the third component with respect to one epoxy equivalent of the copolymer. When the chemical equivalent is less than 0.7, the removability of the resist ink film at the developing step is deteriorated because an excess amount of epoxy groups remains in the ultraviolet-curable resin. On the other hand, when the chemical equivalent is more than 1.2, unreacted ethylenically-unsaturated monomer having single carboxyl group remains in the ultraviolet-curable resin.

As the saturated or unsaturated polybasic acid anhydride used to prepare the ultraviolet-curable resin (B), it is possible to use the above-listed polybasic acid anhydrides used to prepare the epoxy acrylate ultraviolet-curable resin. The polybasic acid anhydride presents an acid value to the ultraviolet-curable resin (B). A main purpose of the use of the polybasic acid anhydride is to provide the dissolubility of the ultraviolet curable resin by a diluted alkaline solution such as an aqueous solution of caustic soda, caustic potash, metasilicate soda, alkyl amine or alkanol amine. It is preferred that a compounding amount of the polybasic acid anhydride is determined such that the acid value of the ultraviolet-curable resin is in a range of 25 to 150, and more preferably 40 to 100. When the acid value is less than 25, defects occur in the developing step. When the acid value is more than 150, the electrical properties, electrical corrosion resistance, and the waterproof of the cured resist ink are deteriorated.

For example, the addition reaction of the (meth) acrylic acid to the copolymer can be performed by the use of a thermal polymerization inhibitor such as a hydroquinone and hydroquinone monomethyl ether, and a catalyst such as a tertiary amine, a quaternary ammonium salt or triphenyl stibine. The tertiary amine comprises benzyl dimethyl amine and triethylamine. The quaternary salt comprises trimethyl benzyl ammonium chloride and methyl triethyl ammonium chloride. The addition reaction may be performed at a temperature range of 60 to 150 ° C., and preferably 80 to 120° C. In addition, the addition reaction of the saturated or unsaturated polybasic acid anhydride to the copolymer may be performed under the conditions similar to the above.

It is preferred that a weight-average molecular weight of the ultraviolet-curable resin (B) is in a range of 3000 to 100000. When the weight-average molecular weight is within the range, it is possible to provide a better resolution of the solder resist ink while maintaining excellent light-sensitivity thereof. For example, in case of using glycidyl (meth) acrylate, when the weight-average molecular weight of the ultraviolet-curable resin (B) is in a range of 5000 to 30000, and an amount of glycidyl (meth) acrylate is 60 to 100 mol % with respect to the total amount of the first and second ethylenically-unsaturated monomers, it is possible to provide excellent resolution and high light-sensitivity of the solder resist ink.

A photopolymerization initiator (C) contained in the photo solder resist ink of the present invention is explained in detail. The photopolymerization initiator (C) is important to initiate a photopolymerization according to an ultraviolet radiation to the photo solder resist ink. As the photopolymerization initiator, it is possible to use benzoin, alkyl ether of benzoin such as benzoin methyl ether, benzoin ethyl ether and benzoin isopropyl ether, acetophenone such as acetophenone, 2,2-dimethoxy-2-phenyl acetophenone, 2,2-diethoxy-2-phenyl acetophenone, 1,1-dichloroacetophenone and 1-hydroxy cyclohexyl phenylketone, anthraquinone such as 2-methyl anthraquinone and 2-amyl anthraquinone, thioxanthone such as 2,4-dimethyl thioxanthone, 2,4-diethyl thioxanthone, 2-chlorothioxanthone, 2,4-diisopropyl thioxanthone and 1-chloro-4-propoxy thioxanthone, ketol such as acetophenone dimethylketol and benzyl dimethyl ketol, benzophenone or xanthone such as 3,3-dimethyl-4-methoxy benzophenone, 3,3',4,4'-tetra-(tert-buthyl peroxyl carbonyl) benzophenone and 4-benzoyl-4'-methyl diphenyl sulfido, nitrogen contained compound such as 2-metyl-1-(4-(mehtylthio)phenyl)-2-morpholino-1-propanone, 2-benzoyl-2-dimethyl amino-1-(4-morpholinophenyl)-butanone-1 and 4,4'-bis-diethyl aminobenzophenone, and 2,4,6-trimethyl benzoyldiphenyl phosphine oxide. At least one selected from the above list can be used as the photopolymerization initiator (C). If necessary, the photopolymerization initiator (C) may be used together with a conventional light-polymerization enhancer or sensitizer such as benzoic acids, or tertiary amines such as p-dimethyl aminobenzoic acid ethyl ester, p-dimethyl aminobenzoic acid isoamyl ester and 2-dimethyl aminoethyl benzoate.

The diluent (D) contained in the photo solder resist ink of the present invention is explained in detail. The diluent (D)

is a monomer having a photopolymerization capability and/or an organic solvent. As the monomer, it is possible to use a water-soluble monomer or hydrophilic monomer such as 2-hydroxy ethyl (meth) acrylate, 2-hydroxy propyl (meth) acrylate, N-vinyl pyrrolidone, (meth) acryloylmorpholine, methoxy tetraethyleneglycol (meth) acrylate, methoxy polyethyleneglycol (meth) acrylate, polyethyleneglycol di (meth) acrylate, N,N-dimethyl (meth) acrylamide, N-methylol (meth) acrylamide, N,N-dimethyl aminopropyl (meth) acrylamide, N,N-dimethyl aminoethyl (meth) acrylate, N,N-dimethyl aminopropyl (meth) acrylate, and melamine (meth) acrylate, water-insoluble monomer such as diethyleneglycol di (meth) acrylate, triethyleneglycol di (meth) acrylate, propyleneglycol di (meth) acrylate, tripropyleneglycol di (meth) acrylate, phenoxyethyl (meth) acrylate, tetrahydrofurfuryl (meth) acrylate, cyclohexyl (meth) acrylate, trimethylolpropane di (meth) acrylate, pentaerythritol tri (meth) acrylate, pentaerythritol tetra (meth) acrylate, dipentaerythritol penta (meth) acrylate, dipentaerythritol hexa (meth) acrylate, isobonyl (meth) acrylate, cyclopentanyl (mono- or di-) (meth) acrylate, cyclopentenyl (mono- or di-) (meth) acrylate, and monoester or polyester of polybasic acid and hydroxyalkyl (meth) acrylate, and a (meth) acrylate monomer such as polyester (meth) acrylate and urethane (meth) acrylate. At least one selected from the above list can be used as the monomer.

As the organic solvent, it is possible to use an alcohol such as ethanol, propyl alcohol, isopropyl alcohol, butyl alcohol, isobutyl alcohol, 2-butyl alcohol, hexanol, and ethyleneglycol, ketone such as methyl ethyl ketone and cyclohexanone, aromatic hydrocarbon such as toluene and xylene, oil aromatic mixed solvent such as "SWASOL SERIES" manufactured by Maruzen Oil Company Ltd., and "Solvesso SERIES" manufactured by EXXON CHEMICAL COMPANY, cellosolve such as cellosolve and butyl cellosolve, carbitol such as carbitol and butyl carbitol, propyleneglycol alkyl ether such as propyleneglycol methyl ether, a polypropyleneglycol alkyl ether such as dipropyleneglycol methyl ether, acetic ester such as ethyl acetate, butyl acetate, cellosolve acetate, butyl cellosolve acetate, butyl carbitol acetate, and propyleneglycol monomethyl ether acetate, and a dialkylglycol ether. At least one selected from the above list can be used as the organic solvent.

The monomer having the photopolymerization capability dilutes a polymer component to improve the easiness of applying the solder resist ink, and adjust the acid value of the solder resist ink to provide a suitable photopolymerization property. The organic solvent dissolves and dilutes the polymer component. The organic solvent is removed from the solder resist ink to obtain a dried film of the solder resist ink.

To prepare the photo solder resist ink of the present invention, it is preferred to adopt the following compounding amounts of the epoxy resin (A), the ultraviolet-curable resin (B), and the photopolymerization initiator (C). The compounding amount of the epoxy resin (A) is 0.1 to 50 wt %, and more preferably 0.1 to 30 wt % with respect to the total of the compounding amounts of (A), (B) and (C). The compounding amount of the epoxy resin (B) is 20 to 80 wt % with respect to the total of the compounding amounts of (A), (B) and (C). The above range may be preferably used to improve the removability of the solder resist ink at the developing step, resolution of the solder resist ink, film strength, film hardness, chemical resistance, electrical corrosion resistance, and the resistance to gold plating of the cured film of the solder resist ink. The compounding amount of the photopolymerization initiator (C) is 0.1 to 30 wt % with respect to the total of the compounding amounts of (A), (B) and (C). The above range of the photopolymerization initiator (C) may be preferably used to improve the light-sensitivity of the solder resist ink and the physical properties of the cured film of the solder resist ink.

When the diluent (D) contains both of the monomer and the organic solvent, it is preferred to adopt the following compounding amounts of the epoxy resin (A), the ultraviolet-curable resin (B), the photopolymerization initiator (C) and the diluent (D) to prepare the photo solder resist ink of the present invention. That is, the compounding amount of the epoxy resin (A) is 0.1 to 50 wt %, and more preferably 0.1 to 30 wt % with respect to the total amount of the photo solder resist ink components except for the organic solvent. The compounding amount of the epoxy resin (B) is 20 to 80 wt % with respect to the total amount of the photo solder resist ink components except for the organic solvent. The compounding amount of the photopolymerization initiator (C) is 0.1 to 30 wt % with respect to the total amount of the photo solder resist ink components except for the organic solvent. The compounding amount of the monomer of the diluent (D) is 50 wt % or less with respect to the total amount of the photo solder resist ink components except for the organic solvent. When the compounding amount of the monomer is more than 50 wt %, the surface tackiness of the dried resist film increases, so that a contamination of a mask mounted on the resist film at the exposing step easily occurs. On the other hand, the compounding amount of the organic solvent of the diluent (D) is in a range from 5 wt % to 98 wt % with respect to the total amount of the photo solder resist ink components. When the compounding amount of the organic solvent is within the range, the easiness of applying the solder resist ink is improved.

When the diluent (D) is the organic solvent, it is preferred to adopt the following compounding amounts of the epoxy resin (A), the ultraviolet-curable resin (B), the photopolymerization initiator (C) and the diluent (D) to prepare the photo solder resist ink of the present invention. That is, the compounding amount of the epoxy resin (A) is 0.1 to 50 wt %, and more preferably 0.1 to 30 wt % with respect to the total amount of the photo solder resist ink components except for the diluent (D). The compounding amount of the epoxy resin (B) is 20 to 80 wt % with respect to the total amount of the photo solder resist ink components except for the diluent (D). The compounding amount of the photopolymerization initiator (C) is 0.1 to 30 wt % with respect to the total amount of the photo solder resist ink components except for the diluent (D). The compounding amount of the organic solvent of the diluent (D) is in a range from 5 wt % to 98 wt % with respect to the total amount of the photo solder resist ink components.

If necessary, the photo solder resist ink of the present invention may contain a blocked isocyanate which is an isocyanate compound such as tolylene diisocyanate, morpholine diisocyanate, isophorone diisocyanate, and hexamethylene diisocyanate blocked by caprolactam, oxime or malonic ester. In addition, the photo solder resist ink may contain an amino resin such as n-butylated melamine resin, isobutylated melamine resin, butylated urea resin, butylated melamine urea co-condensation resin, benzoguanamine co-condensation resin as a thermosetting component, an ultraviolet-curable epoxy acrylate obtained by adding a (meth) acrylic acid to an epoxy resin such as bisphenol A-type epoxy resin, phenol novolac-type epoxy resin, cresol novolac-type epoxy resin and alcyclic epoxy resin, an adduct obtained by adding a saturated or unsaturated polybasic acid anhydride such as maleic anhydride, succinic anhydride, itaconic anhydride, phthalic anhydride, and tetrahydrophthalic anhydride, to the ultraviolet-curable epoxy acrylate, an ultraviolet-curable polymer obtained by reacting a (meth) acrylate having an epoxy group or a hydroxyalkyl (meth) acrylate with a copolymer of maleic anhydride and an ethylenically unsaturated monomer, a copolymer of an ethylenically unsaturated compound such as styrene-(meth) acrylic acid-(meth) acrylic ester copolymer, an ultraviolet-curable copolymer obtained by reacting anyone of the aforementioned compounds with an ethylenically unsaturated monomer having an epoxy group, an ultraviolet-curable polymer obtained by an addition of a (meth) acrylic acid to a vinyl copolymer in which an ethylenically unsaturated monomer having an epoxy group is a unit of monomer, or a high molecular compound such as a styrene-maleic acid resin, diallyl phthalate resin, phenoxy resin, melamine resin, urethane resin, and a fluorine contained resin.

In addition, the photo solder resist ink of the present invention can contain a curing agent or a curing enhancer of the epoxy resin such as imidazole derivatives, polyamines, guanamines, tertiary amines, quaternary ammonium salts, polyphenols, and polybasic acid anhydrides, a filler or a coloring agent such as barium sulfate, silicon oxide, talc, clay and calcium carbonate, a leveling agent such as a fluorine surface active agent, silicon and acrylate copolymer, an adhesive agent such as a silane coupling agent, a thixotropic agent such as AEROSIL, a polymerization inhibitor such as a hydroquinone, hydroquinone monomethyl ether, pyrogallol, tert-butylcatechol, and phenothiazine, an antihalation agent, a flame retardant, a defoamer, an anti-oxidant, or a high molecular dispersing agent.

By the way, a visible-light curability or infrared curability can be provided to the photo solder resist ink of the present invention while maintaining the ultraviolet curability by using a combination of imidazolyl dimer and a cyclic ketone having aminophenyl group, combination of polycyclic quinone and a tertiary amine, or a combination of merocyanine and a triazine derivative, a light-polymerization initiator such as a borate complex of cation dye, and a sensitizer. The photopolymerization initiator is useful to a laser exposing method using a visible ray or infrared ray.

To obtain the photo solder resist ink of the present invention, the above-explained components and additives can be compounded by means of a three-roll, ball mill, sand mill, and so on. For example, a first mixture is prepared by mixing a part of the diluent (E) and the epoxy resin (A). A second mixture is prepared by mixing the ultraviolet curable resin (C), the photopolymerization initiator (D), and the rest of the diluent (E). The solder resist ink of the present invention is obtained by mixing the first mixture with the second mixture immediately before the use.

Figure 7A:
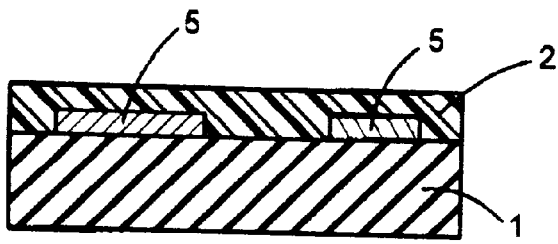
FIGS. 7A to 7E are schematic diagrams illustrating a method of manufacturing a printed circuit board by using a photo solder resist ink of the present invention.
Figure 7B:
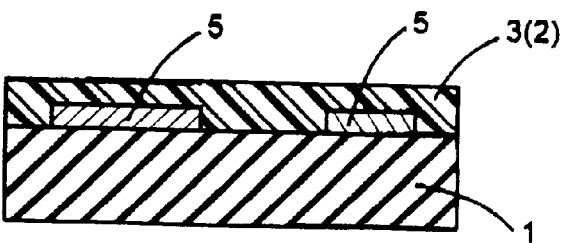
Figure 7C:
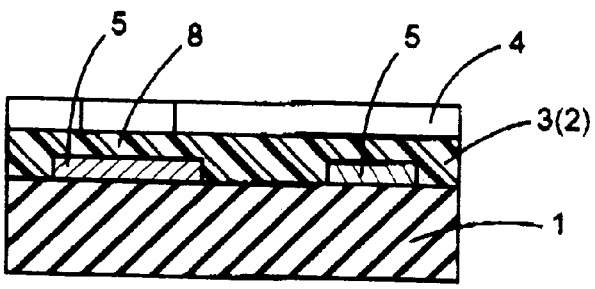
Figure 7D:
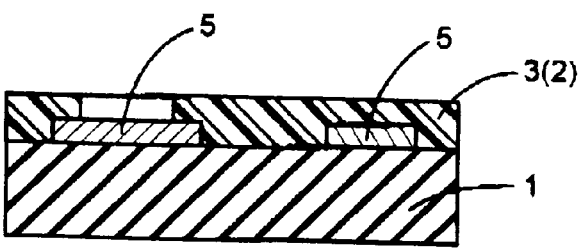

As an example, a method of manufacturing a printed circuit board by using the photo solder resist ink of the present invention is explained in detail. The resist ink is applied to a surface of a substrate 1 having a conductor circuit pattern 5 by means of dipping, spraying, spin coating, roll coating, curtain coating, screen printing, and so on, to thereby obtain a resist ink layer 2 on the substrate, as shown in FIG. 7A. For example, an applying amount of the resist ink is 10 to 200 g/m². Then, the resist layer 2 on the substrate 1 is heated to obtain a dried resist ink layer 3, as shown in FIG. 7B. This step is the precuring step. The precuring step can be performed at a temperature of 40 to 120° C. for 5 to 90 minutes. A mask 4 having a desired pattern is mounted on the dried resist ink layer 3 by a vacuum adhesion method. It is preferred to use the mask 4 made of polyethylene terephthalate (PET). Then ultraviolet is radiated to the dried resist film 3 through the mask 4, as shown in FIG. 7C. This is the exposing step of the resist ink. It is preferred that the radiation amount of ultraviolet is 10 to 1000 mJ/cm². After the mask 4 is removed from the resist ink layer 3, an unexposed portion 8 of the is resist ink layer 3 is selectively dissolved by an alkaline solution, as shown in FIG. 7D. This is the developing step of the resist ink. As the alkaline solution, it is preferred to use an aqueous solution of sodium carbonate or potassium carbonate. The concentration of the aqueous solution may be 0.1 to 5 wt %.

Figure 7E:
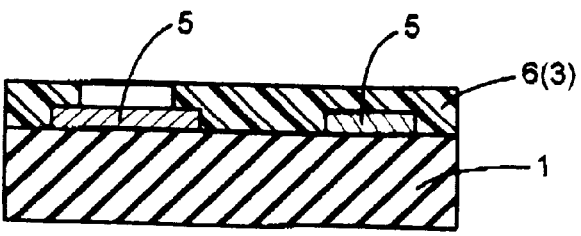

The pattern of the exposed resist ink layer 3 on the substrate 1 is cured to obtain a solder resist 6, as shown in FIG. 7E. This is the post-baking step of the resist ink. The post-baking step may be performed at a temperature of 120 to 180° C. for 10 to 100 minutes. If necessary, a thick resist ink layer can be formed on the substrate 1 by repeating the applying step and the precuring step.

EXAMPLE 1

A 70 wt % epoxy resin (A-1) solution of Example 1 was prepared according to the following process. That is, 300 parts by weight of an epoxy compound "EPICLON N-680" (manufactured by DAINIPPON INK AND CHEMICALS INCORPORATED, Epoxy Equivalents: 214) was dissolved in 100 parts by weight of carbitol acetate at a raised temperature to obtain a first mixture in a flask having a reflux cooler, thermometer and an agitator. The epoxy compound is a cresol novolac-type epoxy resin. A weight-average molecular weight of the epoxy compound is 3200. The weight-average molecular weight is of a peak corresponding to the maximum molecular weight and maximum area in a GPC (Gel Permeation Chromatography) peak. In the GPC measurement, a THF (tetrahydrofuran) solution having a concentration of 10 mg/ml was used. An injection amount of the THF solution is 100 μl. Details of the GPC measurement are shown in TABLE 1.

TABLE 1

| | |
|---|---|
| GPC Measuring Apparatus: | SHODEX SYSTEM 11 manufactured by Showa Denko K.K. |
| Column: | SHODEX KF-800P, KF-805, KF-803 and KF-801 in series |
| Transfer Layer: | THF (Tetrahydrofuran) |
| Flow Rate: | 1 ml/min. |
| Column Temperature | 45° C. |
| Detector | RI |
| Conversion | Polystyrene |

Next, 8 parts by weight of 2,4-tolylene diisocyanate and 0.04 parts by weight of dibutyltin dilaurate were added to the first mixture, while a resultant mixture being agitated. The resultant mixture was held at a temperature of 70 to 80° C. for 5 hours to obtain a second mixture. Additionally, 10 parts by weight of an aromatic solvent "SWASOL" 1500 (manufactured by Maruzen Petrochemical Co., Ltd.) and 22 parts by weight of dipropyleneglycol monomethyl ether were added to the second mixture. The resultant was agitated and cooled to obtain the epoxy resin (A-1) solution.

A solvent component was removed from the epoxy resin (A-1) solution to obtain an epoxy resin (A-1) of Example 1. A GPC chart of the epoxy resin (A-1) is shown in FIG. 1. An arrow in FIG. 1 indicates a GPC peak 1 showing an increased portion of molecular weight as a result of the chain extension by isocyanate. A weight-average molecular weight of the GPC peak 1 of the epoxy resin (A-1) is 16000.

Figure 2:
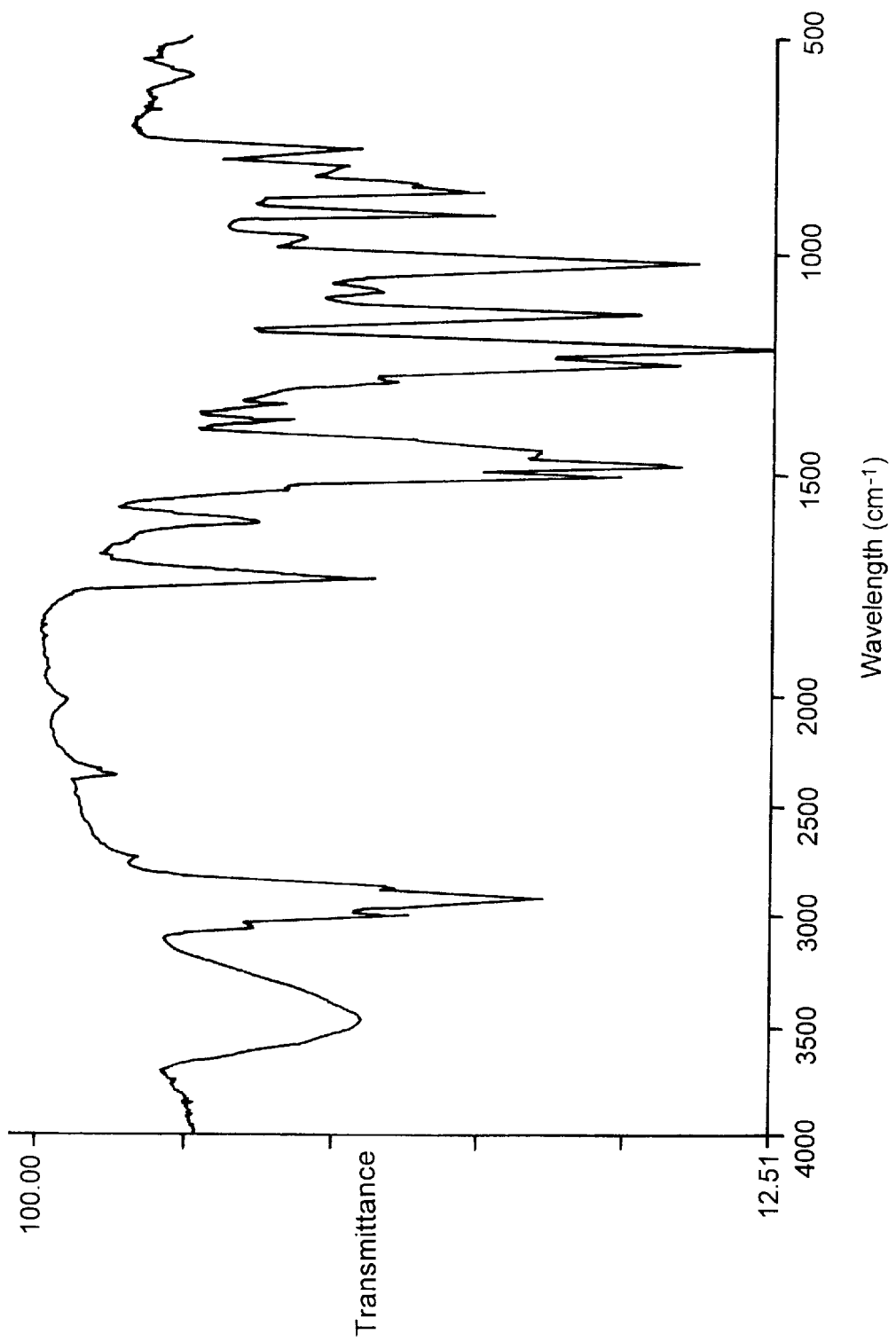
FIG. 2 shows an infrared absorption spectrum of the epoxy resin (A-1)

An IR absorption spectrum of the epoxy resin (A-1) is shown in FIG. 2. The measurement of the IR absorption spectrum was carried out by KBr method. From an IR absorption spectrum of the epoxy resin (A-1), it is confirmed that an IR absorption of 2270 cm$^{-1}$ derived from isocyanate group disappears. This means that 2,4-tolylene diisocyanate quantitatively reacted.

A 65 wt % epoxy acrylate ultraviolet-curable resin (B-1) solution used in Example 1 was prepared according to the following process. 214 parts by weight of a cresol novolac-type epoxy resin "EPICLON N-680" (manufactured by DAINIPPON INK AND CHEMICALS INCORPORATED, Epoxy Equivalent 214) was dissolved in 60 parts by weight of carbitol acetate at a raised temperature to obtain a fourth mixture. Next, 74 parts by weight of acrylic acid, 0.1 parts by weight of hydroquinone, and 0.7 parts by weight of benzyldimethylamine were added to the fourth mixture, and then the resultant mixture was held at a temperature of 90 to 100° C. for 24 hours to obtain a fifth mixture. After the fifth mixture is cooled, 66 parts be weight of carbitol acetate, 70 parts by weight of an aromatic solvent "SWASOL 1500" (manufactured by Maruzen Petrochemical Co., Ltd.), and 76 parts by weight of tetrahydrophthalic anhydride were added to the fifth mixture to obtain a sixth mixture. The sixth mixture was heated at 100° C. and held for about 3 hours while being agitated, to thereby obtain the 65 wt % epoxy acrylate ultraviolet-curable resin (B-1) solution.

A 65 wt % epoxy acrylate solution was prepared according to the following process. 214 parts by weight of a cresol novolac-type epoxy resin "EPICLON N-680" (manufactured by DAINIPPON INK AND CHEMICALS INCORPORATED, Epoxy Equivalents: 214) was dissolved in 60 parts by weight of carbitol acetate at a raised temperature to obtain a first mixture. Next, 74 parts by weight of acrylic acid, 0.1 parts by weight of hydroquinone, and 0.7 parts by weight of benzyldimethylamine were added to the first mixture, while the resultant is agitated. The resultant mixture was held at a temperature of 90 to 100° C. for 24 hours to obtain a second mixture. After 95 parts by weight of carbitol acetate was added to the second mixture, the resultant was agitated and cooled to obtain the 65 wt % epoxy acrylate solution.

As listed in TABLE 2, 12 parts by weight of the epoxy resin (A-1) solution, 50 parts by weight of the ultraviolet curable resin (B-1) solution, and required amounts of the 65 wt % epoxy acrylate solution, a photopolymerization initiator, diluent, and additive agents were mixed while a resultant mixture is agitated, to obtain a photo solder resist ink of Example 1 of the present invention.

EXAMPLE 2

A 70 wt % epoxy resin (A-2) solution of Example 2 was prepared according to a substantially same process as Example 1 except for the followings. That is, 300 parts by weight of an epoxy compound "EPICLON N-865" (manufactured by DAINIPPON INK AND CHEMICALS INCORPORATED) was used in place of the "EPICLON N-680". This epoxy compound is a bisphenol A novolac-type epoxy resin. A weight-average molecular weight of the epoxy compound is 7500. The weight-average molecular weight is of a peak corresponding to the maximum molecular weight and maximum area in a GPC peak. In addition, 10 parts by weight of isophorone dis-isocyanate was used in place of 2,4-tolyrene diisocyanate, and an additive amount of the aromatic solvent "SWASOL 1500" is 11 parts by weight.

Figure 3:
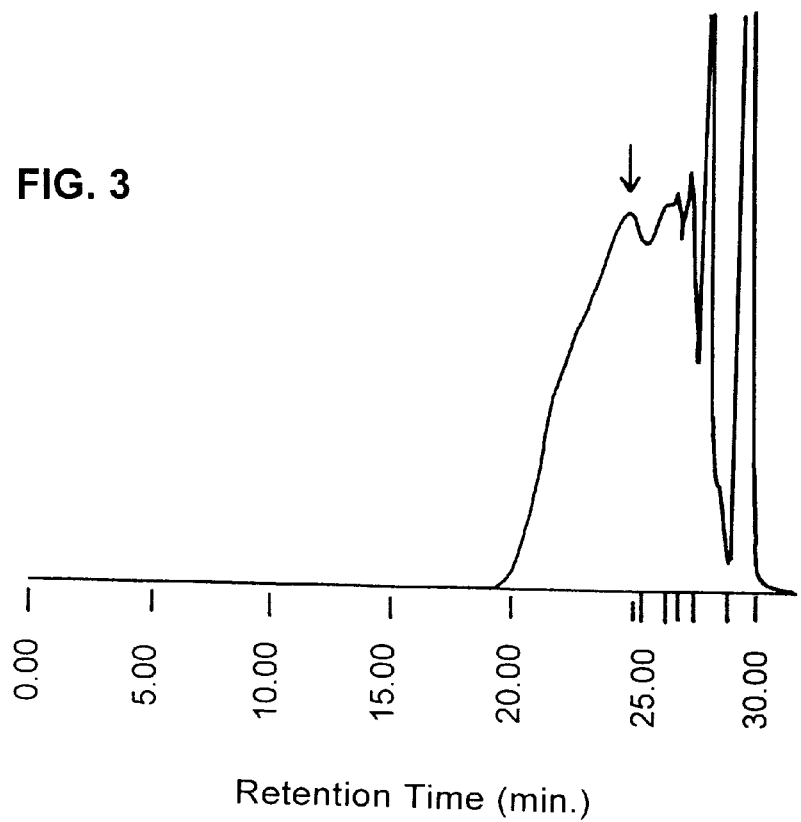
FIG. 3 is a GPC chart of an epoxy resin (A-2) prepared in Example 2 of the present invention.
Figure 4:
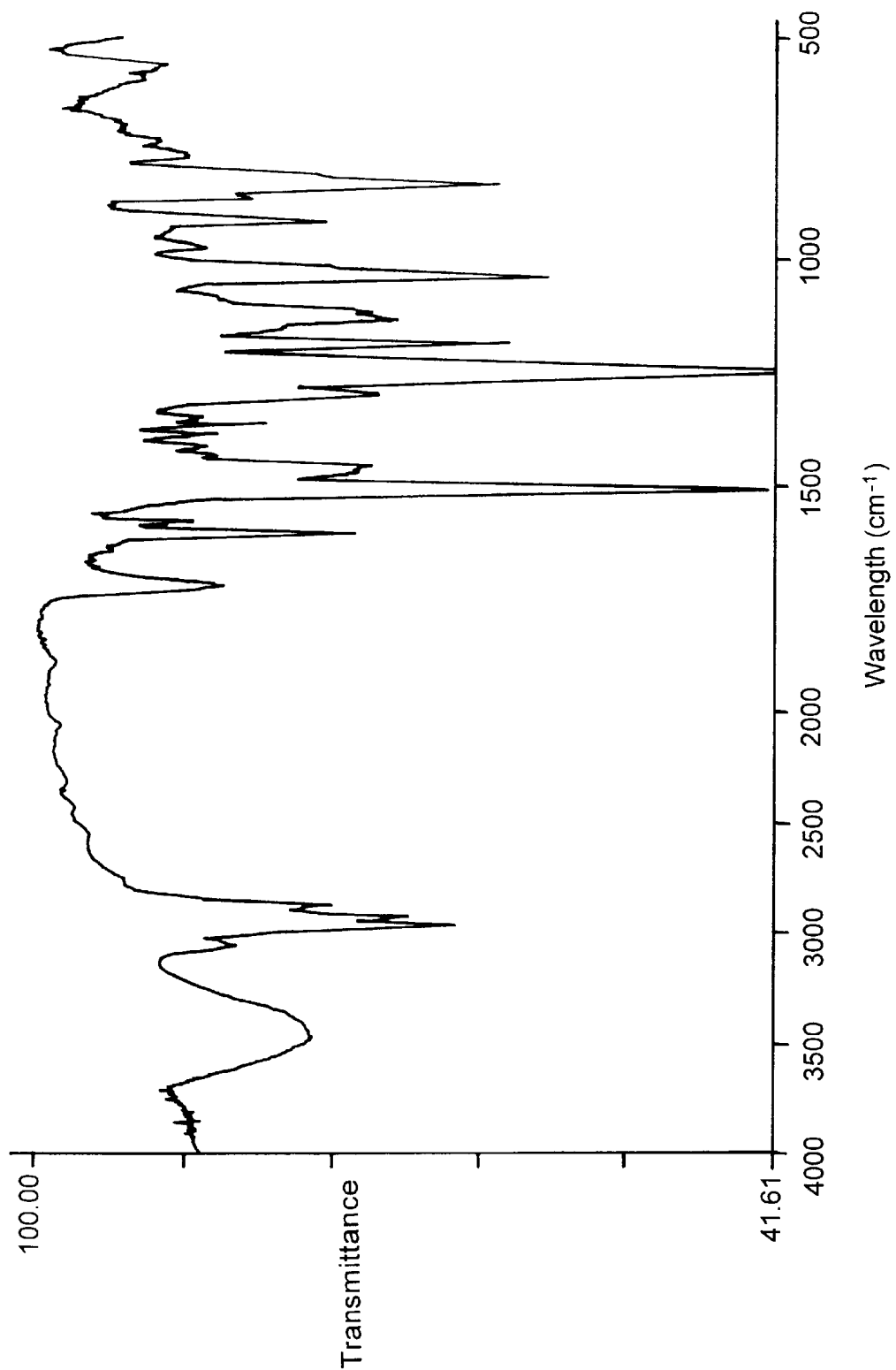
FIG. 4 shows an infrared absorption spectrum of the epoxy resin (A-2)

A solvent component was removed from the epoxy resin (A-2) solution to obtain an epoxy resin (A-2). A GPC chart of the epoxy resin (A-2) is shown in FIG. 3. An arrow in FIG. 3 indicates a GPC peak 1 showing an increased portion of molecular weight as a result of the chain extension by isocyanate. A weight-average molecular weight of the GPC peak 1 of the epoxy resin (A-2) is 26000. An IR absorption spectrum of the epoxy resin (A-2) is shown in FIG. 4. From an IR absorption spectrum of the epoxy resin (A-2), it is confirmed that an IR absorption of 2260 cm$^{-1}$ derived from isocyanate group disappears. It means that isophorone dis-isocyanate quantitatively reacted.

As listed in TABLE 2, 12 parts by weight of the epoxy resin (A-2) solution, 50 parts by weight of the ultraviolet curable resin (B-1) solution, and required amounts of a photopolymerization initiator, diluent, and additive agents were mixed while a resultant mixture is agitated, to obtain a photo solder resist ink of Example 2 of the present invention.

EXAMPLE 3

A 70 wt % epoxy resin (A-3) solution of Example 3 was prepared according to a substantially same process as Example 1 except for the followings. That is, 300 parts by weight of an epoxy compound "EPICLON N-770" (manufactured by DAINIPPON INK AND CHEMICALS INCORPORATED) was used in place of the "EPICLON N-680". This epoxy compound is a phenol novolac-type epoxy resin. A weight-average molecular weight of the epoxy compound is 10000. The weight-average molecular weight is of a peak corresponding to the maximum molecular weight and maximum area in a GPC peak.

Figure 5:
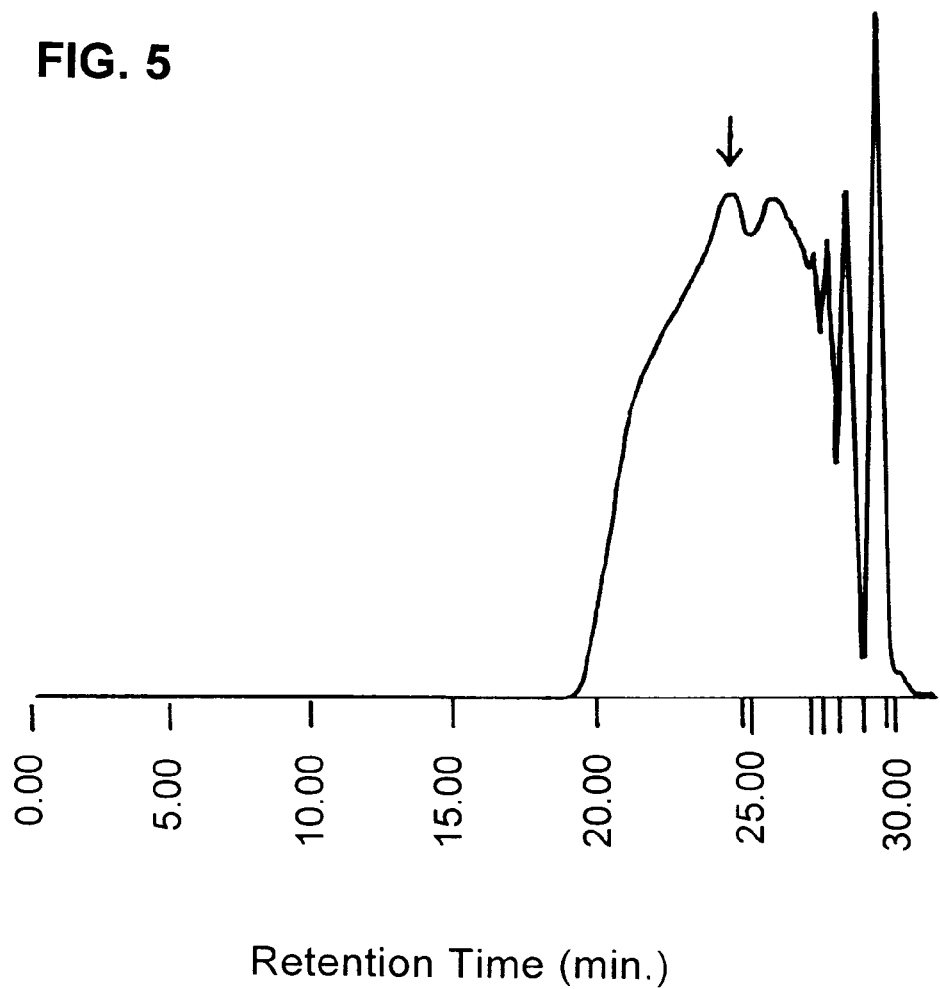
FIG. 5 is a GPC chart of an epoxy resin (A-3) prepared in Example 3 of the present invention.
Figure 6:
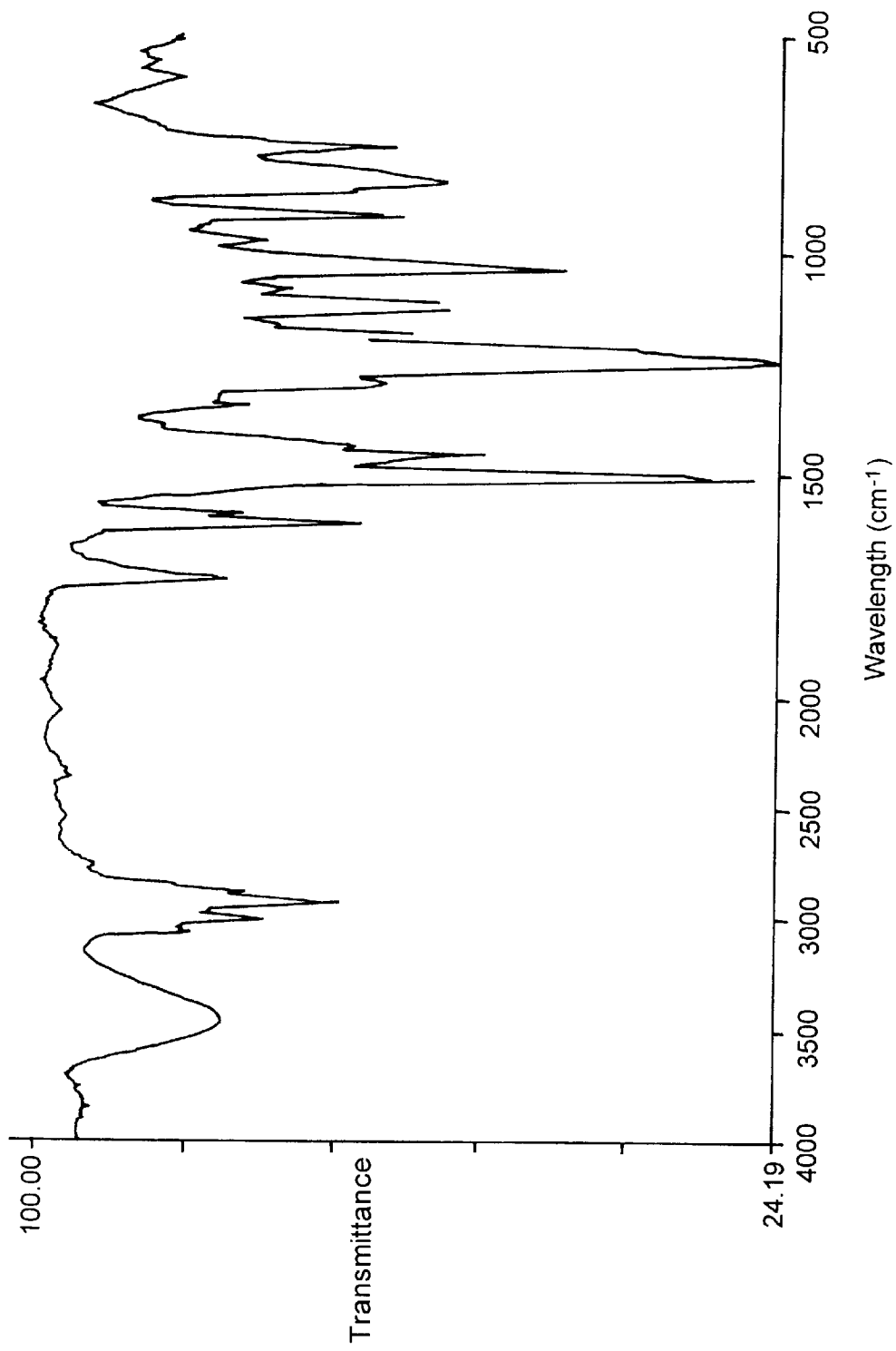
FIG. 6 shows an infrared absorption spectrum of the epoxy resin (A-3)

A solvent component was removed from the epoxy resin (A-3) solution to obtain an epoxy resin (A-3). A GPC chart of the epoxy resin (A-3) is shown in FIG. 5. An arrow in FIG. 5 indicates a GPC peak 1 showing an increased portion of molecular weight as a result of the chain extension by isocyanate. A weight-average molecular weight of the GPC peak 1 of the epoxy resin (A-3) is 27000. An IR absorption spectrum of the epoxy resin (A-3) is shown in FIG. 6. From an IR absorption spectrum of the epoxy resin (A-3), it is confirmed that an IR absorption of 2270 cm$^{-1}$ derived from isocyanate group disappears.

A 60 wt % maleic anhydride copolymer type ultraviolet-curable resin (B-2) solution of Example 3 was prepared according to the following process. 150 parts by weight of a styrene-maleic acid copolymer "SMA-1000A" (manufactured by ELF ATOCHEM JAPAN, INC.) was dissolved in 149 parts by weight of carbitol acetate at a raised temperature to obtain a first mixture. Next, 51 parts by weight of 2-hydroxyethyl acrylate, 0. 1parts by weight of hydroquinone, and 1 part by weight of trimethylamine were added to the first mixture, and then the resultant mixture was held at a temperature of 90° C. for 12 hours to obtain a second mixture. 22 parts be weight of n-butyl alcohol was added to the second mixture, and then held at a temperature of 100° C. for 12 hours to obtain the 60 wt % maleic anhydride copolymer type ultraviolet-curable resin (B-2) solution.

As listed in TABLE 2, 12 parts by weight of the epoxy resin (A-3) solution, 50 parts by weight of the ultraviolet curable resin (B-2) solution, and required amounts of a photopolymerization initiator, diluent, and additive agents were mixed while a resultant mixture is agitated, to obtain a photo solder resist ink of Example 3 of the present invention.

EXAMPLE 4

A photo solder resist ink of Example 4 of the present invention was prepared by mixing 9 parts by weight of the epoxy resin (A-1) solution of Example 1, 2 parts by weight of the epoxy compound "EPICLON N-680", 50 parts by weight of the ultraviolet curable resin (B-2) solution of Example 3, and required amounts of a photopolymerization initiator, is diluent, and additive agents, while agitating a resultant mixture, as listed in TABLE 2.

EXAMPLE 5

The epoxy resin (A-1) solution of Example 1 was used in Example 5. A 50 wt % ultraviolet curable resin (B-3) solution of Example 5 was prepared according to the following process. That is, a polymerization of 70 parts by weight of glycidyl (meth) acrylate, 10 parts by weight of methyl (meth) acrylate, 20 parts by weight of tert-butyl (meth) acrylate, 100 parts by weight of carbitol acetate, 0.3 parts by weight of laurylmercaptan, and 3 parts by weight of azobisisobutyronitrile were performed at a temperature of 75° C. for 5 hours under a nitrogen flow, to thereby obtain a 50 wt % copolymer solution. Next, 0.05 parts by weight of hydroquinone, 37 parts by weight of acrylic acid, and 0.2 parts by weight of dimethylbenzylamine were added to the copolymer solution to obtain a first mixture. The first mixture was held at 105° C. for 24 hours. Subsequently, 38 parts by weight of tetrahydrophthalic anhydride and 72 parts by weight of carbitol acetate were added to the first mixture to obtain a second mixture. The second mixture was held at 100° C. for 3 hours to obtain the 50 wt % ultraviolet curable resin (B-3) solution. A weight-average molecular weight of this solution is 22000.

As listed in TABLE 4, 12 parts by weight of the epoxy resin (A-1) solution, 50 parts by weight of the ultraviolet curable resin (B-3) solution, and required amounts of a photopolymerization initiator, diluent, and additive agents were mixed while a resultant mixture is agitated, to thereby obtain a photo solder resist ink of Example 5 of the present invention.

EXAMPLE 6

A photo solder resist ink of Example 6 of the present invention was prepared by mixing 12 parts by weight of the epoxy resin (A-2) solution of Example 2, 50 parts by weight of the ultraviolet curable resin (B-3) solution of Example 5, and required amounts of a photopolymerization initiator, diluent, and additive agents, while agitating a resultant mixture, as listed in TABLE 4.

EXAMPLE 7

A photo solder resist ink of Example 7 of the present invention was prepared by mixing 12 parts by weight of the epoxy resin (A-3) solution of Example 3, 50 parts by weight of the ultraviolet curable resin (B-3) solution of Example 5, and required amounts of a photopolymerization initiator, diluent, and additive agents, while agitating a resultant mixture, as listed in TABLE 4.

EXAMPLE 8

A photo solder resist ink of Example 8 of the present invention was prepared by mixing 9 parts by weight of the epoxy resin (A-1) solution of Example 1, 2 parts by weight of the epoxy compound "EPICLON N-680", 50 parts by weight of the ultraviolet curable resin (B-3) solution of Example 5, and required amounts of a photopolymerization initiator, diluent, and additive agents, while agitating a resultant mixture, as listed in TABLE 4.

COMPARATIVE EXAMPLE 1

A photo solder resist ink of Comparative Example 1 was prepared by mixing 10 parts by weight of the epoxy compound "EPICLON N-680", 50 parts by weight of the ultraviolet curable resin (B-1) solution of Example 1, and required amounts of a photopolymerization initiator, diluent, and additive agents, while agitating a resultant mixture, as listed in TABLE 2.

COMPARATIVE EXAMPLE 2

A photo solder resist ink of Comparative Example 2 was prepared by mixing 9 parts by weight of an epoxy compound "YX 4000" (manufactured by Yuka Shell Epoxy Kabushiki Kaisha), 50 parts by weight of the ultraviolet curable resin (B-1) solution of Example 1, and required amounts of a photopolymerization initiator, diluent, and additive agents, while agitating a resultant mixture, as listed in TABLE 2.

COMPARATIVE EXAMPLE 3

A photo solder resist ink of Comparative Example 3 was prepared by mixing 6 parts by weight of an epoxy resin "TEPIC-S" (manufactured by NISSAN CHEMICAL INDUSTRIES), 50 parts by weight of the ultraviolet curable resin (B-2) solution of Example 2,3 parts by weight of the 65 wt % epoxy acrylate solution of Example 1, and required amounts of a photopolymerization initiator, diluent, and additive agents, while agitating a resultant mixture, as listed in TABLE 2.

COMPARATIVE EXAMPLE 4

A photo solder resist ink of Comparative Example 4 was prepared by mixing 10 parts by weight of the epoxy compound "EPICLON N-680", 50 parts by weight of the ultraviolet curable resin (B-3) solution of Example 5, 3 parts by weight of the 65 wt % epoxy acrylate solution of Comparative Example 3, and required amounts of a photopolymerization initiator, diluent, and additive agents, while agitating a resultant mixture, as listed in TABLE 4.

COMPARATIVE EXAMPLE 5

A photo solder resist ink of Comparative Example 5 was prepared by mixing 9 parts by weight of an epoxy compound "YX 4000" (manufactured by Yuka Shell Epoxy Kabushiki Kaisha), 50 parts by weight of the ultraviolet curable resin (B-3) solution of Example 5, and required amounts of a photopolymerization initiator, diluent, and additive agents, while agitating a resultant mixture, as listed in TABLE 4.

COMPARATIVE EXAMPLE 6

A photo solder resist ink of Comparative Example 6 was prepared by mixing 6 parts by weight of an epoxy resin "TEPIC-S" (manufactured by NISSAN CHEMICAL INDUSTRIES), 50 parts by weight of the ultraviolet curable resin (B-3) solution of Example 5, 3 parts by weight of the 65 wt % epoxy acrylate solution of Comparative Example 3, and required amounts of a photopolymerization initiator, diluent, and additive agents, while agitating a resultant mixture, as listed in TABLE 4.

With respect to the photo solder resist inks of Examples 1–8 and Comparative Examples 1–6, various kinds of evaluation tests explained below were performed.

[1] Surface Tackiness

Each of the solder resist inks was applied on a plurality of copper clad laminates by screen printing to obtain test samples. The clad laminates are a glass epoxy substrate with a copper foil of a thickness of 35 $\mu$m. To volatilize a solvent component from the applied resist ink, the test samples are dried at 80° C. for three different dry times, i.e., 10, 20 and 30 minutes, to obtain three kinds of dried resist ink films having a thickness of about 20 μm as test pieces. A mask having a desired pattern was directly mounted on each of the dried resist ink films under a reduced pressure, and then 150 mJ/cm$^2$ of ultraviolet was radiated to the respective resist ink film through the mask. After the ultraviolet radiation, the surface tackiness of the dried resist ink film was evaluated by removing the mask from the resist ink film. Results are shown in TABLES 3 and 5. In these TABLES, the symbol "◯" designates that the mask can be readily removed from the dried resist ink film without remaining a sign of the mask on the resist ink film. The symbol "Δ" designates that the mask can be removed from the dried resist ink film, but the sign of the mask remains on the resist ink film. The symbol "×" designates that it is difficult to remove the mask from the resist ink film, and a damage of the mask occurs if the mask is forcedly removed therefrom.

[2] Precuring Acceptable Width

Each of the resist inks was applied on a plurality copper clad laminates by screen-printing to obtain test samples. The clad laminates are a glass epoxy substrate with a copper foil of a thickness of 35 μm. To volatilize a solvent component from the applied resist ink, the test samples are dried at 80° C. for eight different dry times, i.e., 10, 20, 30, 40, 50, 60, 70, and 80 minutes, to obtain eight kinds of dried resist ink films having a thickness of about 20 μm as test pieces. A mask having a desired pattern was mounted on each of the dried resist ink films under a reduced pressure, and then an optimum amount of ultraviolet was radiated to the respective resist ink film through the mask. After the ultraviolet radiation, each of the dried resist ink films was developed by a 1% sodium carbonate aqueous solution. The removability of the resist ink film by the alkaline aqueous solution and the curability of the resist ink film by the ultraviolet radiation were evaluated. Results are shown in TABLES 3 and 5. In these TABLES, the symbol "◯" designates that an unexposed portion of the resist ink film can be readily removed to provide a sharp patterning of the resist ink film. The symbol "Δ" designates that it takes an extended time period to remove the unexposed portion of the resist ink film, and it is difficult to provide a fine patterning. The symbol "×" designates that the unexposed portion of the resist ink film can not be removed by the alkaline aqueous solution.

[3] Remaining Step Numbers

Each of the resist inks was applied on a plurality of copper clad laminates by screen-printing to obtain test samples. The clad laminates are a glass epoxy substrate with a copper foil of a thickness of 35 μm. To volatilize a solvent component from the applied resist ink, the test samples were dried at 80° C. for 20 minutes to obtain dried resist ink films having a thickness of about 20 μm as test pieces. A mask "STEP TABLET PHOTEC" used as an exposing test material (manufactured by Hitachi Chemical Co., Ltd.) was mounted on each of the dried resist ink films under a reduced pressure. 50 mJ/cm$^2$ of ultraviolet was radiated to one of the dried resist ink films through the mask. 150 mJ/cm$^2$ of ultraviolet was radiated to the other one of the dried resist ink films through the mask. Subsequently, the resist ink films were developed by a 1 % sodium carbonate aqueous solution. After the developing step, the remaining step numbers were counted to evaluate a degree of exposure sensitivity. Results are shown in TABLES 3 and 5.

To evaluate the properties of printed circuit boards manufactured by using the photo solder resist inks of Examples 1–8 and Comparative Examples 1–6, test pieces were formed according to the following steps (a) to (e).

(a) Applying Step

Each of the resist inks was applied on a substrate having a conductor pattern by screen printing to obtain a resist ink film thereon. The substrate is a glass epoxy substrate with a copper foil of a thickness of 35 μm.

(b) Precuring Step

To volatilize a solvent component from the resist ink film, the resist ink film was dried at 80° C. for 20 minutes to obtain a dried ink film having a thickness of about 20 μm.

(c) Exposing Step

A mask was mounted on the dried ink film, 150 mJ/cm$^2$ of ultraviolet was radiated to the dried ink film through the mask.

(d) Developing Step

An unexposed portion of the resist ink film was selectively removed by a 1% sodium carbonate aqueous solution to form a pattern of the exposed ink film on the substrate.

(e) Post-baking Step

After the developing step, the patterned resist ink film on the substrate was cured at 150° C. for 30 minutes to obtain a solder resist as the test piece.

[4] Resolution

The mask used in the developing step has a plurality of slits formed in concentric circles. A slit width and a width between adjacent slits are 40 μm. A sharpness of the solder resist pattern was observed to evaluate the resolution. Results are shown in TABLES 3 and 5. In these TABLES, the symbol "◯" designates that a sharp outline of the solder resist pattern can be obtained without cracks or chippings. The symbol "Δ" designates that the sharp outline of the solder resist pattern can be obtained, but the occurrence of cracks or chippings are partially observed. The symbol "×" designates that it is difficult to obtain the sharp outline of the solder resist pattern.

[5] Resistance to Molten Solder

A water-soluble flux "LONCO 3355-11" (manufactured by London Chemical Co., Ltd.) was applied on the test pieces. One of the test pieces was dipped once in a molten solder bath at 260° C. for 10 seconds. As to the other one of the test pieces, the dipping step was repeated five times. After the dipping step, test pieces were washed by water. In each of the test pieces, a degree of discoloration-to-white was observed to evaluate the resistance to molten solder. Results are shown in TABLES 3 and 5. In these TABLES, the symbol "◯" designates that the discoloration-to-white is not observed. The symbol "Δ" designates that the discoloration-to-white is partially observed. The symbol "×" designates that the discoloration-to-white is remarkably observed.

In addition, a crosscut test was performed according to JIS (Japan Industrial Standard) D 0202 by the use of a cellophane adhesive tape. Results are shown in TABLES 3 and 5. In these TABLES, the symbol "◯" designates that no peeling-off of the solder resist is observed at the crosscut portion. The symbol "Δ" designates that the peeling-off of the solder resist is partially observed at the cross-cut portion. The symbol "×" designates that the peeling-off of the solder resist already occurs before the crosscut test.

[6] Film Hardness of Pencil Lead.

A hardness of the solder resist was measured according to JIS K 5400. Results are shown in TABLES 3 and 5.

[7] Resistance to Gold Plating

After a gold-plating was performed on each of the test pieces by using an electroless nickel-plating bath and an electroless gold-plating bath, an adhesion of the resist film to the substrate was evaluated by the use of an adhesion tape. Results are shown in TABLES 3 and 5. In these TABLES, the symbol "○" designates that no peeling-off of the resist film is observed. The symbol "Δ" designates that the peeling-off of the resist film is partially observed. The symbol "×" designates that the peeling-off of the resist film is remarkably observed.

TABLE 2

| Composition | EXAMPLE | | | | COMPARATIVE EXAMPLE | | |
|---|---|---|---|---|---|---|---|
| | 1 | 2 | 3 | 4 | 1 | 2 | 3 |
| 70 wt % Epoxy Resin (A-1) solution | 12 | | | 9 | | | |
| 70 wt % Epoxy Resin (A-2) solution | | 12 | | | | | |
| 70 wt % Epoxy Resin (A-3) solution | | | 12 | | | | |
| EPICLON N-680 | | | | | 2 | 1.0 | |
| YX 4000 (*1) | | | | | | 9 | |
| TEPIC-S (*2) | | | | | | | 6 |
| 65 wt % Epoxy Acrylate Ultraviolet-Curable Resin (B-1) Solution | 50 | 50 | | | 50 | 50 | |
| 60 wt % Maleic Anhydride Copolymer Ultraviolet-Curable Resin (B-2) Solution | | | 50 | 50 | | | 50 |
| 65 wt % Epoxy Acrylate Solution | 3 | | | | | | 3 |
| Dipentaerythritol hexa (meth) acrylate | 7 | 7 | 7 | 7 | 4 | 4 | 7 |
| Irgacure 907 (*3) | 4 | 4 | 4 | 4 | 4 | 4 | 4 |
| KAYACURE DETX-S (*4) | 0.5 | 0.5 | 0.5 | 0.5 | 0.5 | 0.5 | 0.5 |
| Modaflow (*5) | 1 | 1 | 1 | 1 | 1 | 1 | 1 |
| Silica (Average grain Size: 1 μm) | 10 | 10 | 7 | 7 | 10 | 10 | 7 |
| Barium sulfate | 17 | 20 | 20 | 20 | 17 | 17 | 20 |
| Melamine | 1 | 1 | 1 | 1 | 1 | 1 | 1 |
| Phthalocyanine Green | 0.5 | 0.5 | 0.5 | 0.5 | 0.5 | 0.5 | 0.5 |
| Carbitol Acetate | | | | 1 | 3 | 3 | 3 |

(*1): An epoxy compound having the epoxy equivalent of 195 manufactured by Yuka Shell Epoxy Kabushiki Kaisha.
(*2): An epoxy resin having the epoxy equivalent of 100 manufactured by NISSAN CHEMICAL INDUSTRIES.
(*3): A photopolymerization initiator manufactured by CIBA-GEIGY CORPORATION.
(*4): A photopolymerization initiator manufactured by NIPPON KAYAKU CO., LTD.
(*5): A leveling agent manufactured by MONSANTO COMPANY.

TABLE 3

| Test Items | EXAMPLE | | | | COMPARATIVE EXAMPLE | | |
|---|---|---|---|---|---|---|---|
| | 1 | 2 | 3 | 4 | 1 | 2 | 3 |
| Precure Property/ Dry Temperature (80° C.) | | | | | | | |
| Surface Tackiness | | | | | | | |
| Dry Time: 10 min. | ○ | ○ | ○ | ○ | Δ | ○ | Δ |
| Dry Time: 20 min. | ○ | ○ | ○ | ○ | ○ | ○ | Δ |
| Dry Time: 30 min. | ○ | ○ | ○ | ○ | ○ | ○ | Δ |
| Precuring Acceptable Width | | | | | | | |
| Dry Time: 10 min. | ○ | ○ | ○ | ○ | ○ | ○ | ○ |
| Dry Time: 20 min. | ○ | ○ | ○ | ○ | ○ | ○ | ○ |
| Dry Time: 30 min. | ○ | ○ | ○ | ○ | ○ | ○ | ○ |
| Dry Time: 40 min. | ○ | ○ | ○ | ○ | ○ | ○ | ○ |
| Dry Time: 50 min. | ○ | ○ | ○ | ○ | × | ○ | ○ |
| Dry Time: 60 min. | ○ | ○ | ○ | ○ | × | ○ | ○ |
| Dry Time: 70 min. | ○ | ○ | ○ | ○ | × | ○ | Δ |
| Dry Time: 80 min. | ○ | ○ | ○ | ○ | × | Δ | Δ |
| Remaining Step Number | | | | | | | |
| Light Amount: 50 mJ/cm² | 6 | 6 | 6 | 6 | 5 | 5 | 5 |
| Light Amount: 150 mJ/cm² | 9 | 9 | 9 | 9 | 8 | 8 | 8 |
| Properties of Test Pieces | | | | | | | |
| Resolution | ○ | ○ | ○ | ○ | ○ | ○ | ○ |
| Film Hardness by Pencil Lead | 6H | 6H | 6H | 6H | 6H | 5H | 5H |
| Surface Brilliance | ○ | ○ | ○ | ○ | ○ | ○ | ○ |
| Adhesion between Solder Resist and Substrate | ○ | ○ | ○ | ○ | ○ | ○ | ○ |
| Resistance to molten solder | | | | | | | |
| Soldering (1 time) | | | | | | | |
| Discoloration to White | None | None | None | None | None | None | None |
| Adhesion | ○ | ○ | ○ | ○ | ○ | ○ | ○ |
| Soldering (5 times) | | | | | | | |
| Discoloration to White | None | None | None | None | None | None | None |
| Adhesion | ○ | ○ | ○ | ○ | Δ | × | Δ |
| Solvent Resistance | ○ | ○ | ○ | ○ | ○ | ○ | ○ |
| Acid Resistance | ○ | ○ | ○ | ○ | ○ | ○ | ○ |
| Resistance to Gold Plating | ○ | ○ | ○ | ○ | Δ | Δ | Δ |
| Electrical Corrosion Resistance | ○ | ○ | ○ | ○ | ○ | ○ | ○ |

TABLE 4

| Composition | EXAMPLE | | | | COMPARATIVE EXAMPLE | | |
|---|---|---|---|---|---|---|---|
| | 5 | 6 | 7 | 8 | 4 | 5 | 6 |
| 70 wt % Epoxy Resin (A-1) solution | 12 | | | | 9 | | |
| 70 wt % Epoxy Resin (A-2) solution | | 12 | | | | | |
| 70 wt % Epoxy Resin (A-3) solution | | | 12 | | | | |
| EPICLON N-680 | | | | 2 | 1.0 | | |
| YX 4000 (*1) | | | | | | 9 | |
| TEPIC-S (*2) | | | | | | | 6 |
| 50 wt % Ultraviolet-Curable Resin (B-3) Solution | 50 | 50 | 50 | 50 | 50 | 50 | 50 |
| 65 wt % Epoxy Acrylate Solution | 3 | | | | 3 | | 3 |
| Dipentaerythritol hexa (meth) acrylate | 7 | 7 | 7 | 7 | 7 | 4 | 7 |
| Irgacure 907 (*3) | 4 | 4 | 4 | 4 | 4 | 4 | 4 |
| KAYACURE DETX-S (*4) | 0.5 | 0.5 | 0.5 | 0.5 | 0.5 | 0.5 | 0.5 |
| Modaflow (*5) | 1 | 1 | 1 | 1 | 1 | 1 | 1 |
| Silica (Average grain Size: 1 μm) | 10 | 10 | 7 | 7 | 10 | 10 | 7 |
| Barium sulfate | 17 | 20 | 20 | 20 | 17 | 17 | 20 |
| Melamine | 1 | 1 | 1 | 1 | 1 | 1 | 1 |

TABLE 4-continued

|  | EXAMPLE | | | | COMPARATIVE EXAMPLE | | |
|---|---|---|---|---|---|---|---|
| Composition | 5 | 6 | 7 | 8 | 4 | 5 | 6 |
| Phthalocyanine Green | 0.5 | 0.5 | 0.5 | 0.5 | 0.5 | 0.5 | 0.5 |
| Carbitol Acetate |  |  |  | 1 | 3 | 3 | 3 |

(*1): An epoxy compound having the epoxy equivalent of 195 manufactured by Yuka Shell Epoxy Kabushiki Kaisha.
(*2): An epoxy resin having the epoxy equivalent of 100 manufactured by NISSAN CHEMICAL INDUSTRIES.
(*3): A photopolymerization initiator manufactured by CIBA-GEIGY CORPORATION.
(*4): A photopolymerization initiator manufactured by NIPPON KAYAKU CO., LTD.
(*5): A leveling agent manufactured by MONSANTO COMPANY.

TABLE 5

|  | EXAMPLE | | | | COMPARATIVE EXAMPLE | | |
|---|---|---|---|---|---|---|---|
| Test Items | 5 | 6 | 7 | 8 | 4 | 5 | 6 |
| Precure Property/ Dry Temperature (80° C.) | | | | | | | |
| Surface Tackiness | | | | | | | |
| Dry Time: 10 min. | ○ | ○ | ○ | ○ | Δ | ○ | Δ |
| Dry Time: 20 min. | ○ | ○ | ○ | ○ | ○ | ○ | Δ |
| Dry Time: 30 min. | ○ | ○ | ○ | ○ | ○ | ○ | Δ |
| Precuring Acceptable Width | | | | | | | |
| Dry Time: 10 min. | ○ | ○ | ○ | ○ | ○ | ○ | ○ |
| Dry Time: 20 min. | ○ | ○ | ○ | ○ | ○ | ○ | ○ |
| Dry Time: 30 min. | ○ | ○ | ○ | ○ | ○ | ○ | ○ |
| Dry Time: 40 min. | ○ | ○ | ○ | ○ | ○ | ○ | ○ |
| Dry Time: 50 min. | ○ | ○ | ○ | ○ | ○ | ○ | ○ |
| Dry Time: 60 min. | ○ | ○ | ○ | ○ | ○ | ○ | ○ |
| Dry Time: 70 min. | ○ | ○ | ○ | ○ | Δ | ○ | Δ |
| Dry Time: 80 min. | ○ | ○ | ○ | Δ | Δ | Δ | Δ |
| Remaining Step Number | | | | | | | |
| Light Amount: 50 mJ/cm² | 6 | 6 | 6 | 6 | 5 | 5 | 5 |
| Light Amount: 150 mJ/cm² | 9 | 9 | 9 | 9 | 8 | 8 | 8 |
| Properties of Test Pieces | | | | | | | |
| Resolution | ○ | ○ | ○ | ○ | ○ | ○ | ○ |
| Film Hardness by Pencil Lead | 6H | 6H | 6H | 6H | 6H | 5H | 5H |
| Surface Brilliance | ○ | ○ | ○ | ○ | ○ | ○ | ○ |
| Adhesion between Solder Resist and Substrate Resistance to molten solder | ○ | ○ | ○ | ○ | ○ | ○ | ○ |
| Soldering (1 time) | | | | | | | |
| Discoloration to White | None | None | None | None | None | None | None |
| Adhesion | ○ | ○ | ○ | ○ | ○ | ○ | ○ |
| Soldering (5 times) | | | | | | | |
| Discoloration to White | None | None | None | None | None | None | None |
| Adhesion | ○ | ○ | ○ | ○ | Δ | X | Δ |
| Solvent Resistance | ○ | ○ | ○ | ○ | ○ | ○ | ○ |
| Acid Resistance | ○ | ○ | ○ | ○ | ○ | ○ | ○ |
| Resistance to Gold Plating | ○ | ○ | ○ | ○ | Δ | Δ | Δ |
| Electrical Corrosion Resistance | ○ | ○ | ○ | ○ | ○ | ○ | ○ |

What is claimed is:

1. An ultraviolet-curable and alkali-developable photo solder resist ink comprising:
   an epoxy resin obtained by extending chains of an epoxy compound by an isocyanate compound having at least two isocyanate groups per one molecule thereof;
   an ultraviolet-curable resin having a carboxyl group and an ethylenically unsaturated group with a photopolymerization capability;
   a photopolymerization initiator; and
   a diluent.

2. The photo solder resist ink as set forth in claim 1, wherein said epoxy compound is an aromatic epoxy resin.

3. The photo solder resist ink as set forth in claim 2, wherein said aromatic epoxy resin is a novolac-epoxy resin.

4. The photo solder resist ink as set forth in claim 3, wherein said novolac-epoxy resin comprises a phenol novolac-epoxy resin, cresol novolac-epoxy resin, and bisphenol A-novolac-epoxy resin.

5. The photo solder resist ink as set forth in claim 1, wherein said isocyanate compound comprises tolylene diisocyanate, xylylene diisocyanate, hydrogenated xylylene diisocyanate, and isophorone diisocyanate.

6. The photo solder resist ink as set forth in claim 1, wherein said ultraviolet-curable resin is an epoxy acrylate resin which is obtained by an addition reaction of an unsaturated monocarboxylic acid and one of unsaturated and saturated polybasic acid anhydrides to an epoxy resin.

7. The photo solder resist ink as set forth in claim 1, wherein said ultraviolet-curable resin is obtained by a reaction of a copolymer consisting essentially of 40 to 100 mol % of a first ethylenically-unsaturated monomer having an epoxy group and 60 mol % or less of a second ethylenically-unsaturated monomer having a polymerization capability with said first monomer with 0.7 to 1.2 chemical equivalents of a third ethylenically-unsaturated monomer having a single carboxyl group per one epoxy-equivalent of said copolymer and one of saturated and unsaturated polybasic anhydrides.

8. The photo solder resist ink as set forth in claim 7, wherein said first ethylenically-unsaturated monomer is glycidyl (meth) acrylate.

9. The photo solder resist ink as set forth in claim 7, wherein said second ethylenically-unsaturated monomer comprises a (meth) acrylic acid aliphatic ester, (meth) acrylic acid alicyclic ester, hydroxy alkyl (meth) acrylate, alkoxy alkyl (meth) acrylate, and glycerol (meth) acrylate.

10. The photo solder resist ink as set forth in claim 7, wherein said third ethylenically-unsaturated monomer comprises an (meth) acrylic acid, crotonic acid and cinnamic acid.

11. The photo solder resist ink as set forth in claim 1, wherein said diluent comprises at least one of an organic solvent and a monomer having a photopolymerization capability.

* * * * *